United States Patent
Tanigawa et al.

(10) Patent No.: US 8,851,682 B2
(45) Date of Patent: Oct. 7, 2014

(54) DISPLAY MODULE, MANUFACTURING METHOD THEREOF, AND DISPLAY DEVICE

(75) Inventors: Kenichi Tanigawa, Gunma (JP); Minoru Fujita, Gunma (JP)

(73) Assignee: Oki Data Corporation, Tokyo (JP)

( * ) Notice: Subject to any disclaimer, the term of this patent is extended or adjusted under 35 U.S.C. 154(b) by 147 days.

(21) Appl. No.: 13/536,972

(22) Filed: Jun. 28, 2012

(65) Prior Publication Data

US 2013/0002730 A1      Jan. 3, 2013

(30) Foreign Application Priority Data

Jun. 30, 2011   (JP) .................................. 2011-145526

(51) Int. Cl.
| | |
|---|---|
| G03B 21/00 | (2006.01) |
| H01L 25/075 | (2006.01) |
| G02B 27/01 | (2006.01) |
| G02B 3/00 | (2006.01) |
| H01L 33/58 | (2010.01) |

(52) U.S. Cl.
CPC ........ *H01L 25/0753* (2013.01); *G02B 27/0101* (2013.01); *G02B 3/0018* (2013.01); *H01L 33/58* (2013.01)
USPC ................. 353/31; 353/38; 353/94; 353/102; 353/122; 362/235; 362/326

(58) Field of Classification Search
CPC ............. G02B 27/102; G02B 27/1046; G02B 27/149; G02B 27/126; G02B 3/0056; G02B 3/0018; G03B 21/00; G03B 21/20; G03B 21/2033; H01L 2924/12041; H01L 2224/48091; H01L 2924/00014; H01L 27/156; H01L 33/58
USPC ........... 353/31, 38, 94, 102, 122; 349/5, 7–9, 349/104, 201, 112; 362/235, 326
See application file for complete search history.

(56) References Cited

U.S. PATENT DOCUMENTS

| | | | |
|---|---|---|---|
| 6,359,737 B1 | 3/2002 | Stringfellow | |
| 8,517,544 B2* | 8/2013 | Maruyama et al. | 353/122 |
| 2003/0207212 A1 | 11/2003 | Law et al. | |
| 2004/0114111 A1* | 6/2004 | Watanabe | 353/31 |
| 2004/0147059 A1 | 7/2004 | Jeong et al. | |
| 2005/0146652 A1* | 7/2005 | Yokoyama et al. | 349/61 |
| 2005/0270493 A1* | 12/2005 | Nakamura | 353/31 |
| 2005/0270651 A1 | 12/2005 | Boettiger et al. | |

(Continued)

FOREIGN PATENT DOCUMENTS

| | | |
|---|---|---|
| EP | 2 159 780 A2 | 3/2010 |
| JP | 2003-007987 A | 1/2003 |

(Continued)

*Primary Examiner* — Sultan Chowdhury
(74) *Attorney, Agent, or Firm* — Rabin & Berdo, P.C.

(57) ABSTRACT

A display module includes a light emitting element array and a lens array. The light emitting element array includes a plurality of light emitting elements arranged on a substrate and driven by driving signal to emit light. A lens array is configured to focus light emitted by the respective light emitting elements. The lens array includes a plurality of first lens pillars respectively provided on the light emitting elements, a plurality of second lens pillars respectively provided on the first lens pillars and having curved surfaces at tops thereof, and a plurality of lens portions formed so as to cover the first lens pillars and the second lens pillars, the lens portions having curved surfaces at tops thereof. A driving circuit is provided on the substrate.

17 Claims, 19 Drawing Sheets

(56) References Cited

U.S. PATENT DOCUMENTS

2006/0132725 A1\* 6/2006 Terada et al. ............... 353/102
2010/0075262 A1 3/2010 Koefer et al.
2010/0203657 A1 8/2010 Kim
2011/0085329 A1\* 4/2011 Kuo ............................ 362/235

FOREIGN PATENT DOCUMENTS

| JP | 2006-327182 A | 12/2006 |
| JP | 2011-112737 A | 6/2011 |
| WO | WO 2010/116422 A1 | 10/2010 |

\* cited by examiner

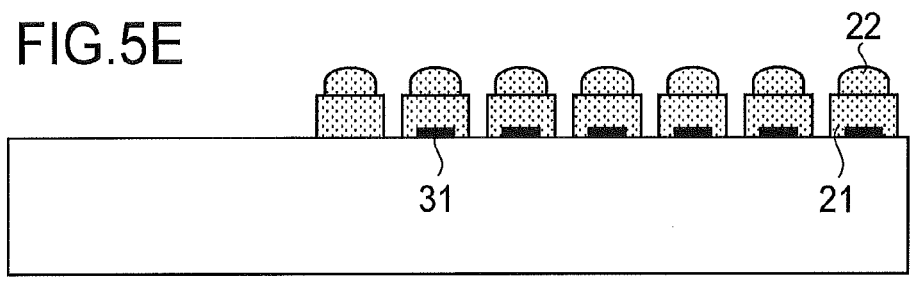
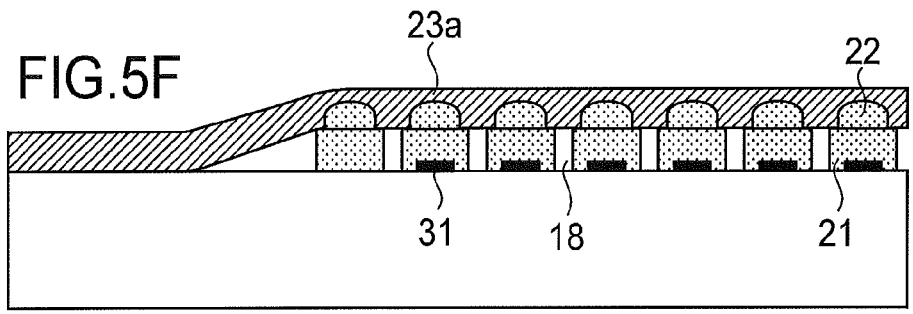
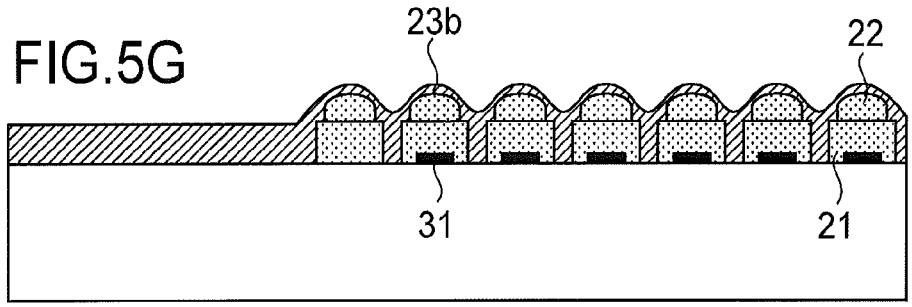
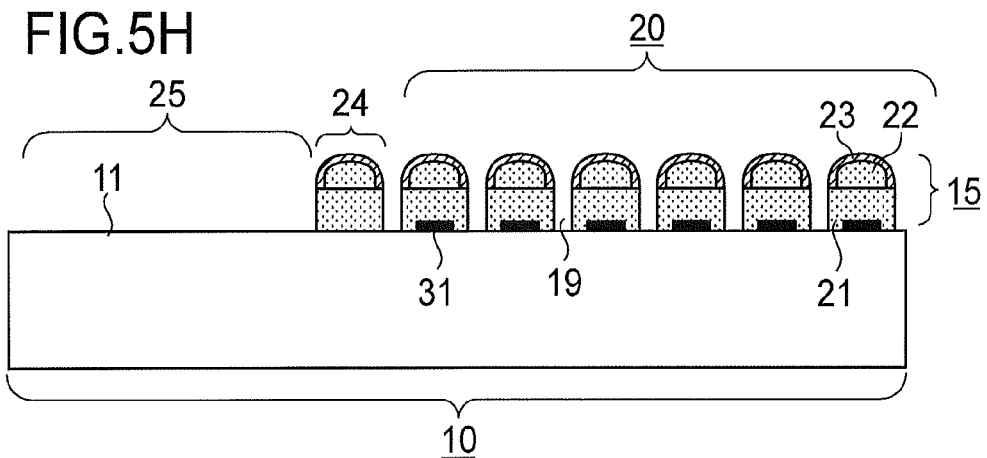

DISPLAY MODULE, MANUFACTURING METHOD THEREOF, AND DISPLAY DEVICE

BACKGROUND OF THE INVENTION

The present invention relates to a display module, a manufacturing method thereof, and a display device using the display module.

Conventionally, there are self-luminous light emitting elements such as a light emitting diode (LED), an organic electroluminescence (EL) element, an inorganic EL element, and non-self-luminous light emitting elements such as a liquid crystal.

A self-luminous light emitting element array is constituted by arranging a plurality of self-luminous light emitting elements two-dimensionally in a matrix. A display device using the self-luminous light emitting element array exhibits lower optical loss and higher light use efficiency, as compared with a light-valve type display device such as a liquid crystal display. When the self-luminous light emitting element array is employed in a direct-view-type display device, the direct-view-type display device can be lightened and thinned, since a backlight can be eliminated.

Further, a projection type display device such as a head up display (HUD), a projector or a rear projector using the non-self-luminous type light emitting elements needs a separate light source. In contrast, a projection type display device using the self-luminous type light emitting element array does not need such a separate light source, and therefore can be compact in size.

In this regard, for example, when the HUD has a display magnification of 5 times, the HUD utilizes light emitted within an angle of 10-20 degrees (i.e., an available angle) from a direction of an optical axis of the light emitting element. However, light emitted by the self-luminous light emitting element array (in which the light emitting elements are arranged in a plane) has a basically Lambertian distribution, and therefore light use efficiency is as low as 3-5%.

In order to enhance light use efficiency of the HUD, it is conceivable to form a microlens array on the light emitting element array to thereby narrow a spread of light, i.e., to increase an amount of light within the available angle. In this case, it is necessary to form an On-Chip microlens array on the light emitting element array, and a lens material (i.e., a material of the microlens array) need be removed from regions of bonding pads.

Japanese Laid-open Patent Publication No. 2006-327182 discloses a method of forming an On-Chip microlens array on the light emitting element array using a glass forming mold, and patterning the microlens array using exposure and development.

However, in the conventional method, the display module is manufactured by forming the microlens array using the glass forming mold, and transferring the microlens array onto the self-luminous light emitting element array. In the transfer process, it is difficult to accurately align the microlens array with the self-luminous light emitting element array. Further, since it is necessary to ensure releasability of the glass forming mold, and to provide a spacer for maintaining a gap between the microlens array and the self-luminous light emitting element array in the direction of the optical axis, the number of manufacturing processes increases.

SUMMARY OF THE INVENTION

According to an aspect of the present invention, it is intended to provide a display module, a manufacturing method thereof, and a display device capable of facilitating manufacturing process.

According to an aspect of the present invention, there is provided a display module including a light emitting element array including a plurality of light emitting elements arranged on a substrate and driven by driving signal to emit light, and a lens array configured to focus light emitted by the light emitting elements. The lens array includes a plurality of first lens pillars respectively provided on the light emitting elements, a plurality of second lens pillars respectively provided on the first lens pillars and having curved surfaces at tops thereof, and a plurality of lens portions formed so as to cover the first lens pillars and the second lens pillars. The lens portions have curved surfaces at tops thereof. The display module further includes a driving circuit provided on the substrate.

With such a configuration, the display module can be manufactured with a simple manufacturing method. Further, the lenses of the lens array can be accurately aligned with the light emitting elements, and light use efficiency of the display module can be enhanced.

According to another aspect of the present invention, there is provided a display module including a light emitting element array including a plurality of light emitting elements arranged on a substrate and driven by driving signal to emit light, and a lens array configured to focus light emitted by the light emitting elements. The lens array includes a plurality of first lens pillars respectively provided on the light emitting elements, a plurality of second lens pillars respectively provided on the first lens pillars in such a manner that at least two second lens pillars are provided on each first lens pillar, and a plurality of lens portions formed so as to cover the first lens pillars and the second lens pillars. Each lens portion has at least two curved surfaces at a top thereof. The display module further includes a driving circuit provided on the substrate.

With such a configuration, optical axes of the lenses of the lens array and optical axes of the light emitting elements can be arbitrarily adjusted, and therefore light use efficiency of the display module can be enhanced.

According to still another aspect of the present invention, there is provided a manufacturing method of a display module. The manufacturing method includes the steps of forming a light emitting element array including a plurality of light emitting elements on a substrate, forming a plurality of first lens pillars respectively on the light emitting elements, forming a lens pillar material so as to cover the first lens pillars and the substrate, softening the lens pillar material by heat treatment so that the lens pillar material has curved surfaces respectively on the first lens pillars, performing a photolithography process on said lens pillar material to thereby form a plurality of second lens pillars having curved surfaces, forming a lens portion material so as to cover the first lens pillars, the second lens pillars and the substrate, softening the lens portion material by heat treatment so that the lens portion material has curved surfaces respectively on the second lens pillars, performing a photolithography process on the lens portion material to thereby form polymerized lens portions, and fixing a driving circuit on the substrate for driving the respective light emitting elements.

According to yet another aspect of the present invention, there is provided a manufacturing method of a display module. The manufacturing method includes the steps of forming a light emitting element array including a plurality of light emitting elements on a substrate, forming a plurality of first lens pillars respectively on the light emitting elements, forming a lens pillar material so as to cover the first lens pillars and the substrate, patterning the lens pillar material by a photolithography process to thereby form a plurality of second lens pillars in such a manner that at least two second lens pillars are provided on each first lens pillar, forming a lens portion material so as to cover the first lens pillars, the second lens pillars and the substrate, softening the lens portion material by heat treatment so that the lens portion material has curved surfaces respectively on the second lens pillars, performing a photolithography process to thereby form polymerized lens portions, and fixing a driving circuit on the substrate for driving the respective light emitting elements.

Further scope of applicability of the present invention will become apparent from the detailed description given hereinafter. However, it should be understood that the detailed description and specific embodiments, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

In the attached drawings:

FIGS. 5A through 5H are schematic sectional views for illustrating a manufacturing method of the display module according to Embodiment 1 of the present invention;

DETAILED DESCRIPTION OF THE PREFERRED EMBODIMENT

Hereinafter, embodiments of the present invention will be described with reference to drawings. The drawings are for the purpose of illustration only, and are not intended to limit the scope of the invention.

Embodiment 1

<Configuration of Display Module>

Figure 1:
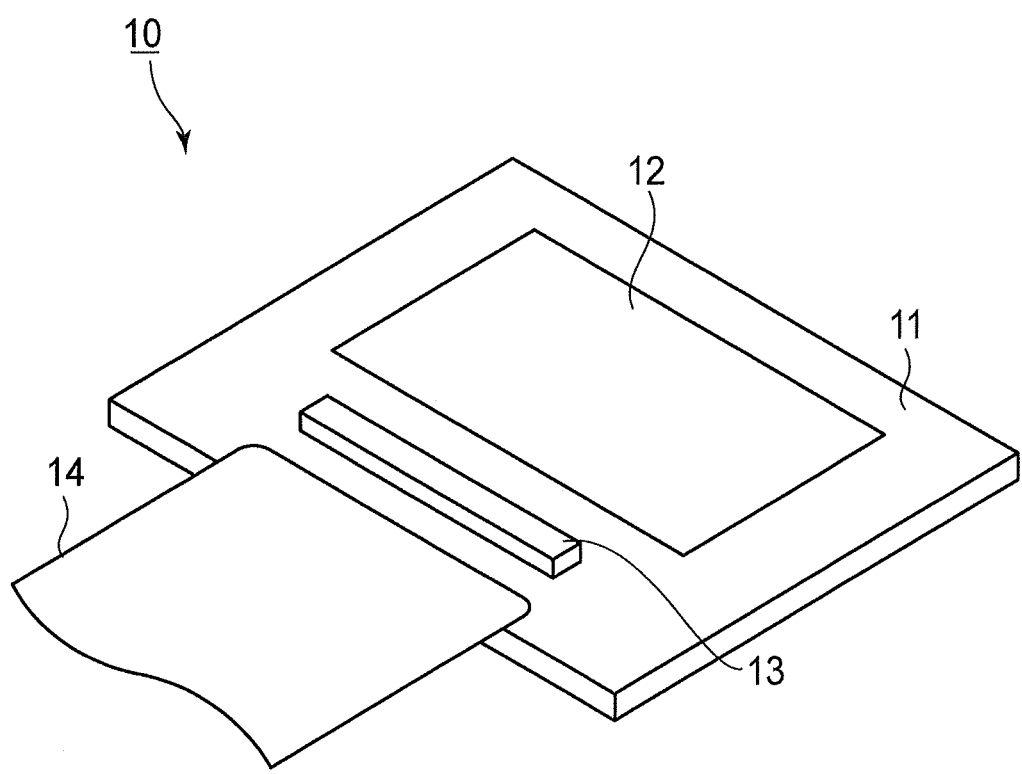
FIG. 1 is a perspective view showing a display module according to Embodiment 1 of the present invention.

FIG. 1 is a perspective view showing a display module 10 according to Embodiment 1 of the present invention.

The display module 10 has a substrate 11. The substrate 11 is composed of, for example, a semiconductor substrate such as Si, GaAs, GaP, InP, GaN or ZnO, a ceramic substrate such as AlN or $Al_2O_3$, a glass substrate, a glass epoxy substrate, a metal substrate such as Cu or Al, a plastic substrate or the like. A wiring pattern (not shown) and an LED (Light Emitting Diode) micro display 12 are formed on the substrate 11. The LED micro display (referred to as an LMD) 12 as a light emitting element array includes a plurality of light emitting elements (more specifically, thin-film semiconductor light emitting elements) such as LEDs or the like. Microlenses (described later) are formed on the respective thin-film semiconductor light emitting elements. The microlenses form a microlens array. In the case where the substrate is formed of an electrical conductive material, an insulation layer is formed between a surface of the substrate 11 and the wiring pattern, and between the surface of the substrate 11 and the thin-film semiconductor light emitting elements.

A driving circuit 13 for driving the LMD 12 and a flat-type flexible cable 14 are fixed to the surface the substrate 11. The LMD 12 and the driving circuit 13 are connected to each other by the wiring pattern (not shown). Terminals (on which bumps are formed) are provided on the substrate 11 side of the driving circuit 13. The terminals are pressed against the wiring pattern (not shown) on the substrate 11 in a face-down manner using, for example, an anisotropic conductive resin (ACF), and are electrically connected to the wiring pattern.

The flat-type flexible cable 14 and the driving circuit 13 are connected to each other using the wiring pattern formed on the substrate 11. The flat-type flexible cable 14 is electrically connected to the wiring pattern by means of pressure bonding using, for example, an anisotropic conductive resin (ACF).

A heat sink and a metal casing (not shown) are attached to a backside of the substrate 11. A heat radiation sheet (not shown) having electrical insulation property is provided between the backside of the substrate 11 and the heat sink and the metal casing, so as to efficiently dissipate heat generated by the LMD 12 and the driving circuit 13.

The driving circuit 13 of the display module 10 is electrically connected to an outside control circuit (not shown) via the flat-type flexible cable 14. The flat-type flexible cable 14 is merely an example of an electrical connection between the driving circuit 13 of the display module 10 and the outside control circuit. The electrical connection between the driving circuit 13 of the display module 10 and the outside control circuit is not limited to the flat-type flexible cable 14.

<Equivalence Circuit of Display Module>

Figure 2:
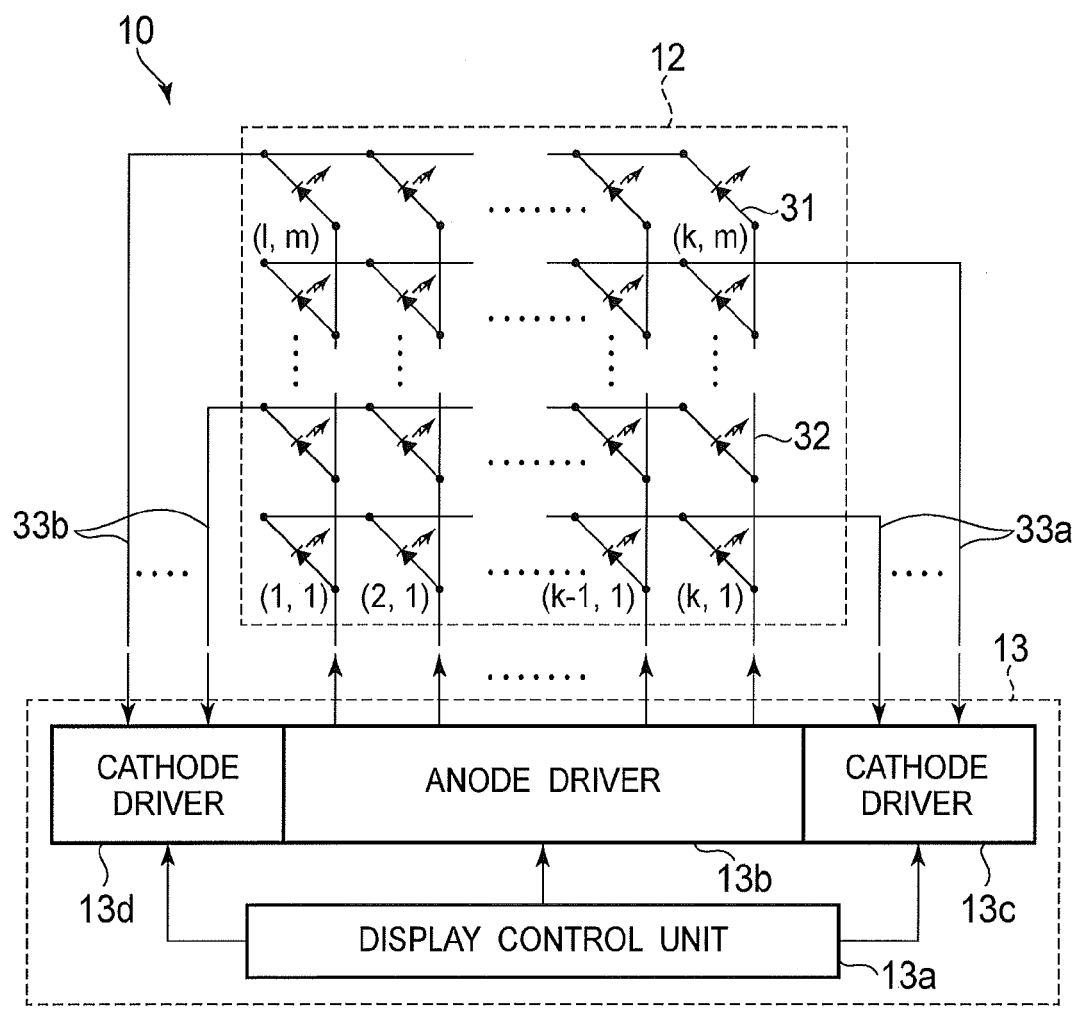
FIG. 2 is a diagram showing an equivalence circuit of the display module according to Embodiment 1 of the present invention.

FIG. 2 is a diagram showing an equivalence circuit of the display module 10.

The display module 10 includes the LMD 12 constituted by a dot matrix of passive-type LEDs arranged in "m" rows and "k" columns, and the driving circuit 13. The driving circuit 13 includes a display control unit 13a, an anode driver 13b, a cathode driver 13c, and a cathode driver 13d. The display control unit 13a, the anode driver 13b, the cathode driver 13c, and the cathode driver 13d are preferably integrated with each other.

The LMD 12 is constituted by a dot matrix of passive-type LEDs arranged in "m" rows and "k" columns. The LMD 12 includes "k" anode wirings 32 arranged in a row direction in parallel with one another, and "m" cathode wirings 33 arranged in a column direction (perpendicular to the row direction) in parallel with one another.

LEDs 31 (1,1) through (m, k) the number of which is m×k are provided at intersection points between the "k" anode wirings 32 and the "m" cathode wirings 33. In this regard, a suffix (m, k) indicates the LED 31 which is m-th in the row direction and k-th in the column direction.

The "k" anode wirings 32 are connected to an anode driver 13b. The "m" cathode wirings 33 are connected to cathode connection wirings 33a and 33b in such a manner that adjacent cathode wirings 33 are connected to mutually different cathode connection wirings 33a and 33b. The odd-numbered cathode wirings 33 are connected to a cathode driver 13c via the cathode wirings 33a the number of which is m/2. The even-numbered cathode wirings 33 are connected to a cathode driver 13d via the cathode wirings 33b the number of which is m/2.

The display control unit 13a is configured to analyze a display data (i.e., image data) or the like sent from the outside control unit or the like, and converts the display data into a matrix data for displaying the display data at a predetermined position on the LMD 12. In the case where image data to be displayed is in the form of a dot data corresponding to pixels (i.e., the LEDs 13 arranged at intersection points of the matrix), the display control unit 13a outputs an anode driving signal and a cathode driving signal for determining dot coordinates. The display control unit 13a also performs frame-by-frame control and performs duty control.

The display control unit 13a includes, for example, a processor or a complex logic circuit having a calculation function, a buffer for transferring data between the processor or the like and the outside control circuit or the like, and a memory circuit for storing data sent from the outside control unit or the like. The display control unit 13a further includes a timing signal generation circuit (i.e., an oscillation circuit) that outputs a timing signal to the control circuit and outputs reading and writing timing signals to the memory circuit. The display control unit 13a further includes a driving signal output circuit that outputs a driving signal representing the display data which is read from the memory circuit or obtained by processing the read data. The display control unit 13a further includes various registers and the like for storing display function, control command and the like sent from outside.

The anode driver 13b has a function to supply electric current to the columns of the LEDs 31 connected to the respective anode wirings 32 of the LMD 12 in response to the anode driving signal (for example, light emission data indicating whether or not to emit light) from the display control unit 13a.

The anode driver 13b includes, for example, a shift register that receives the anode driving signal, performs serial-parallel conversion to the received data, and outputs a parallel light emission data. A latch circuit is connected to an output side of the shift register. The latch circuit is configured to latch the parallel light emission data outputted from the shift register. A constant current circuit is connected to an output side of the latch circuit. The constant current circuit supplies predetermined electric current based on an output signal and an output enable signal from the latch circuit. The anode wirings 32 are connected to an output side of the constant current circuit.

The cathode drivers 13c and 13d have function to perform scanning along the rows of the LEDs 31 connected to the respective cathode wirings 33 in response to the cathode driving signal from the display control unit 13a. The cathode drivers 13c and 13d are constituted by, for example, selector circuits or the like.

<Configuration of Light Emitting Elements with Lenses>

Figure 3:
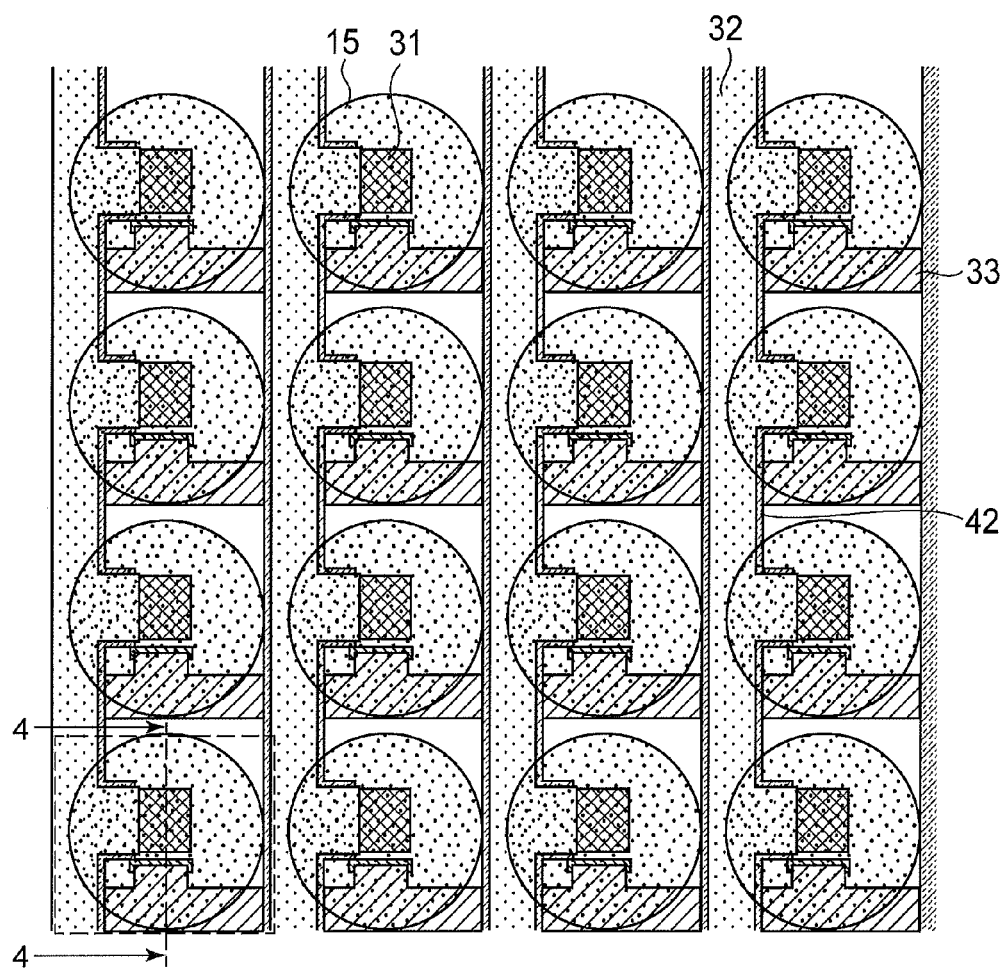
FIG. 3 is an enlarged plan view showing a light emitting element array chip according to Embodiment 1 of the present invention.

FIG. 3 is an enlarged plan view showing the light emitting element array chip according to Embodiment 1 of the present invention.

More specifically, FIG. 3 is an enlarged partial plan view showing a part of the LMD 12 including 4×4 pixels. The LMD 12 includes a plurality of LEDs 31 as thin-film semiconductor light emitting elements formed on the substrate 11, and a plurality of lenses (in this example, microlenses) 15 formed on the respective LEDs 31. The microlenses 15 are aligned with the respective LEDs 31, and are configured to focus light emitted by the LEDs 31. The cathode wirings 33 having band-shapes are formed on the substrate 11, and extend in the row direction (i.e., a right-left direction in FIG. 3). The anode wirings 32 having band-shapes are formed on the substrate 11, and extend in the column direction (i.e., a vertical direction in FIG. 3). The anode wirings 32 are insulated from the cathode wirings 33 by an interlayer insulation film 42. Each microlens 15 has a circular shape, and the respective microlenses 15 are isolated from each other. In this regard, the microlens 15 can have a rectangular shape with rounded corners, and can also have a shape so as to fill a region of a pixel.

Figure 4:
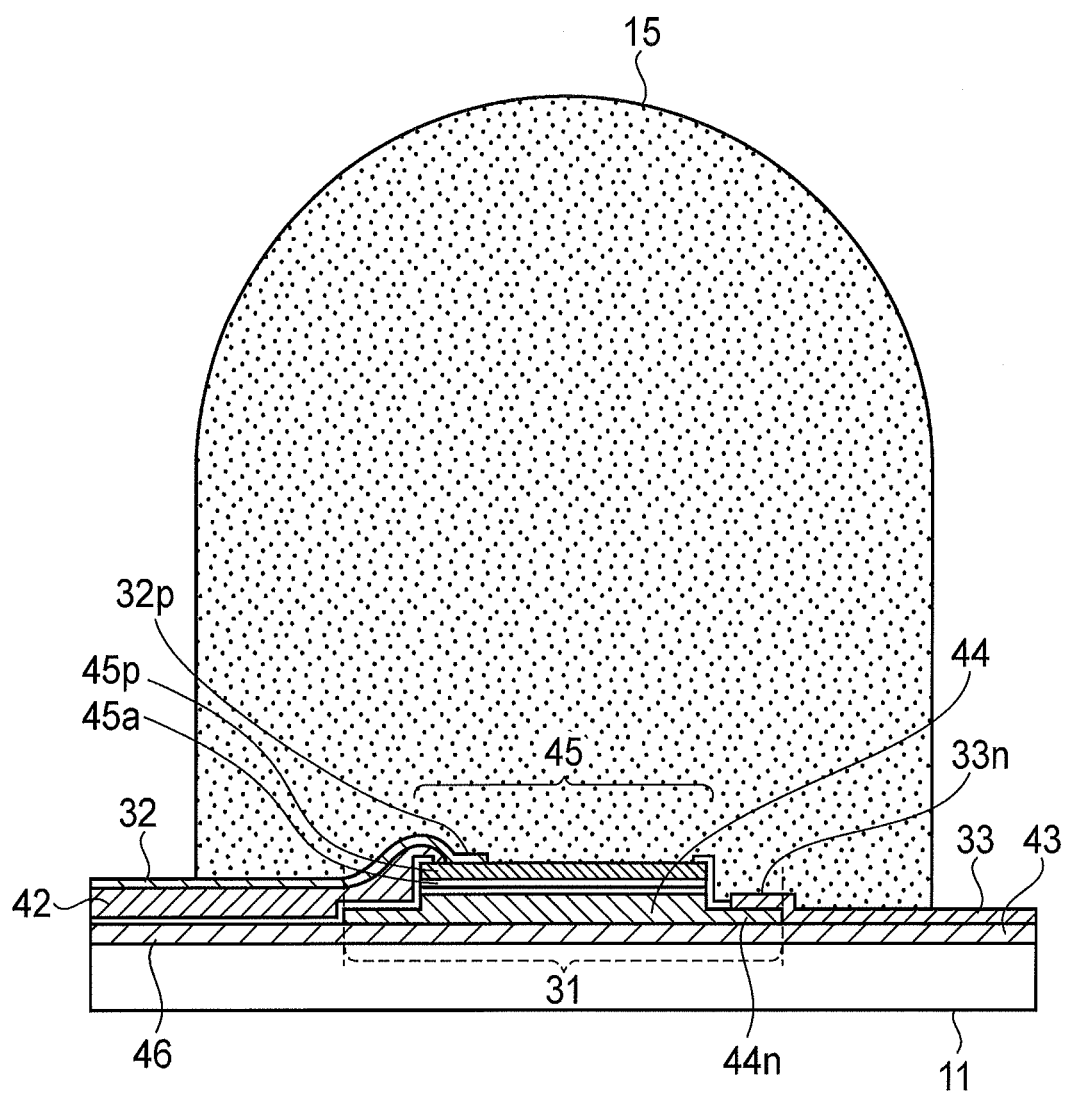
FIG. 4 is an enlarged sectional view taken along line 4-4 in FIG. 3.

FIG. 4 is an enlarged sectional view showing a single pixel taken along line 4-4 in FIG. 3. The LED 31 having a substantially rectangular shape is bonded to the substrate 11 via a planarization layer 43. The LED 31 includes, for example, an N-type semiconductor layer 44 bonded to the planarization layer 43 and a light emitting region 45. The light emitting region 45 has an active layer 45a. A P-type semiconductor layer 45p is formed on a surface of the active layer 45a. The cathode wiring 33 having the band-shape extends on the planarization layer to reach an N-contact portion 44n of the N-type semiconductor layer 44, and makes an ohmic contact with the N-contact portion 44n.

A periphery of the light emitting region 45 is covered with an insulation film 46. The anode wiring 32 having the band-shape is formed on the insulation film 46 via an interlayer insulation film 42, and extends in the column direction (i.e., the vertical direction). The anode wiring 32 makes an ohmic contact with the P-type semiconductor layer 45p of the light emitting region 45 at a P-contact electrode 32p (i.e., a contact region) of the P-type semiconductor layer 45p.

The LMD 12 having the above described configuration is manufactured by, for example, forming the LEDs 31 as the thin-film semiconductor light emitting elements on a growth substrate (not shown), separating the LEDs 31 from the growth substrate, and bonding the LEDs 31 to the substrate 11. A dot matrix structure of the LEDs 31 is formed on the substrate 11. The planarization film 43 as an insulation film is formed between the substrate 11 and the LEDs 31. With such a structure, the LEDs 31 corresponding to the respective pixels are electrically isolated, and a dot matrix structure is formed. The microlenses 15 are formed on the respective LEDs 31.

FIGS. 5A through 5H are schematic sectional views for illustrating a manufacturing method of the display module 10.

As shown in FIG. 5H, the display module 10 has the LMD 12 in which a plurality of LEDs 31 are arranged in a matrix on the substrate 11. The microlenses 15 are formed on the respective LEDs 31 of the LMD 12. The microlenses 15 form a microlens array 20.

A dummy microlens 24 is formed on an outer peripheral region of the microlens array 20. The dummy microlens 24 does not contribute to display of an image. Although one dummy microlens 24 is provided on the outer peripheral region of the microlens array 20 as shown in FIG. 5H, it is also possible to provide a plurality of dummy microlenses 24. Further, it is also possible not to provide the dummy microlens 24.

An LMD-outside region 25 (as a pad region) is provided outside a region where the LMD 12 is formed. The LMD-outside region 25 is used as a pad region for bump connection with the driving circuit 13, a pad region for connection between the flat-type flexible cable 14 and the wiring pattern, and a pad region used in a light emission test of the LMD 12. The LMD-outside region 25 is also used for connection with cathode wirings and anode wirings. In the LMD-outside region 25, the microlenses and a material thereof are removed except for a region where the dummy microlens 24 is formed.

The microlens array 20 includes a plurality of columnar first lens pillars 21 formed on (and aligned with) the respective LEDs 31. Each first lens pillar 21 has a substantially rectangular shape in a vertical section. The microlens array 20 further includes a plurality of columnar second lens pillars 22 formed on the respective first lens pillars 21. Each second lens pillar has a curved top surface. The microlens array 20 further includes a plurality of lens portions 23 covering the respective first lens pillars 21 and the respective second lens pillars 22. Each lens portion 23 has a curved top surface. The lens portions 23 are configured to focus light emitted by the respective LEDs 31.

<Manufacturing Method of Display Module>

A manufacturing method of the display module 10 will be described with reference to FIGS. 5A through 5H.

(1) Formation of LED Element Array

Figure 5A:
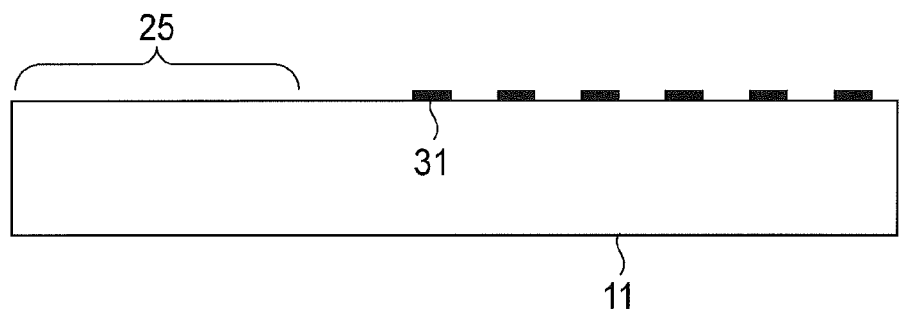

In a process shown in FIG. 5A, the substrate 11 for mounting devices thereon is prepared. The substrate 11 is composed of, for example, a semiconductor substrate such as Si, GaAs, GaP, InP, GaN or ZnO, a ceramic substrate such as AlN or $Al_2O_3$, a glass substrate, a glass epoxy substrate, a metal substrate such as Cu or Al, a plastic substrate or the like.

The LMD 12 including the LEDs 31 arranged in a matrix as shown in FIGS. 2 and 3 is formed on the substrate 11. Further, the anode wirings 32, the cathode wirings 33 and the LMD-outside region 25 are formed on the substrate 11.

The LED 31 is composed of, for example, epitaxially grown III-V group compound semiconductor material such as AlN, GaN, InN, InP, GaP, AlP, AlAs, GaAs, InAs or mixed crystal semiconductor thereof, epitaxially grown II-VI group compound semiconductor material such as ZnO, ZnSe or CdS, or an organic material.

As materials of electrodes of the LEDs 31, the anode wirings 32, the cathode wirings 33, respective connection wirings (not shown) and wirings in respective pad regions (not shown), it is possible to use, for example, Au-based metal such as Au, Ti/Pt/Au, Ti/Au, AuGeNi/Au, AuGe/Ni/Au, or Al-based metal such as Al, Ni/Al, Ni/AlNd, Ni/AlSiCu, Ti/Al. It is also possible to use an oxide-based transparent electrode.

(2) Formation of First Lens Pillars

Figure 5B:
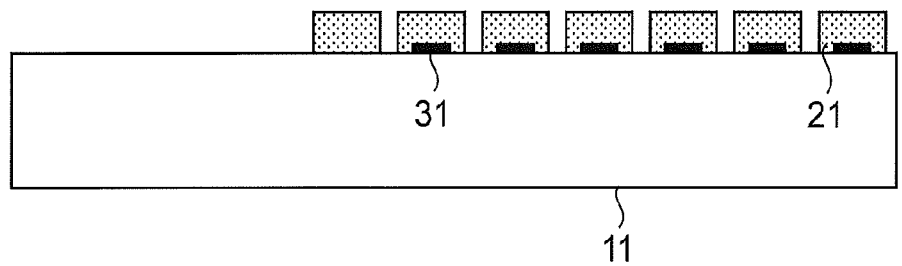

In a process shown in FIG. 5B, a resist (i.e., a material of the first lens pillars 21) is formed on the substrate 11 to a predetermined thickness, and is subjected to a pre-exposure heat treatment if necessary. In order to obtain uniformity across a surface of the substrate 11, the resist is preferably formed by laminating a dry film resist (DFR) using a laminator or by coating using a spray coat method.

A material of the lens pillars 21 is preferably a chemically-amplified thick-film negative resist or DFR formed of epoxy-based resin, silicone-based resin, fluorine-based resin or acryl-based resin.

The DFR is an etching resist in the form of a film. For example, the DFR is formed by drying a photoresist layer coated on a base film and laminating a protection film onto the photoresist layer. The DFR has a trilaminar structure in which a film-like photosensitive resin is sandwiched by the base film having a thickness of 20-25 µm and the protection film. The base film is preferably formed of a bi-axially oriented PET (polyethylene terephthalate) film having an excellent permeability of ultra-violet rays (UV) and having a high transparency and flatness. The protection film is preferably formed of an LDPE (low density polyethylene) film which is a low-fisheye film having a high flatness and suitable releasability with respect to a photoresist layer.

Then, patterning is performed on the resist (i.e., the material of the first lens pillars 21) using a photolithography process to thereby form the columnar first lens pillars 21 at positions corresponding to the respective LEDs 31 at predetermined intervals. Each lens pillar 21 has a substantially rectangular shape in a vertical section.

(3) Transfer of Lens Pillar Material

Figure 5C:
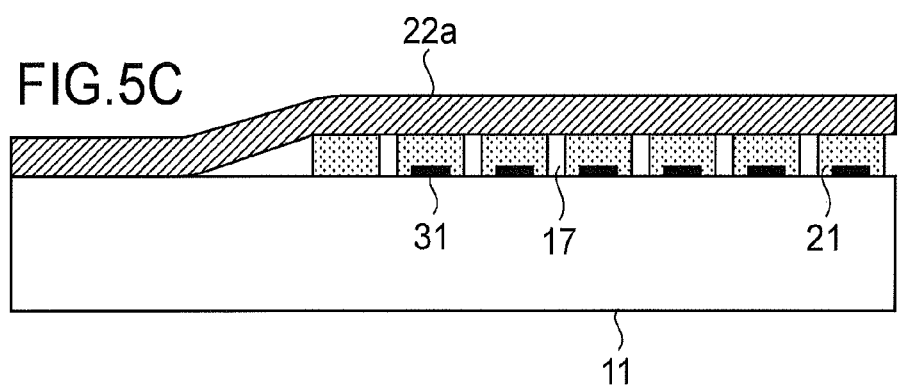

In a process shown in FIG. 5C, a material 22a of the second lens pillars 22 (for example, the DFR) is transferred to the first lens pillars 21 and the substrate 11 so as to leave gaps 17. Hereinafter, the material 22a is referred to as a lens pillar material 22a.

The lens pillar material 22a is preferably a chemically-amplified thick-film negative DFR composed of epoxy-based resin or acryl-based resin. The lens pillar material 22a can be the same as or different from a lens portion material (i.e., a material of the lens portion 23) described later.

In this process, the transferred lens pillar material 22a (transferred to the first lens pillars 21 and the substrate 11) enters into between the first lens pillars 21 so that the gaps 17 are formed below the lens pillar material 22a. This is achieved by, for example, reducing a pressure in a laminator chamber to a predetermined pressure at a predetermined temperature.

(4) Heat Treatment

The lens pillar material 22a and the lens portion material are negative-type resist, and are patterned in a photolithography process including a coating (or transfer), a pre-exposure heat treatment, an exposure, a post-exposure heat treatment, and a development. After being subjected to the exposure, post-exposure heat treatment and the development in the photolithography process, the negative-type resist becomes a polymer material. The negative-type resist before being subjected to the exposure, the post-exposure heat treatment and the development is referred to as a precursor material. The polymer material has a stronger intermolecular bonding force than the precursor material. Therefore, the precursor material and the polymer material have different softening temperatures. That is, the softening temperature of the precursor material is lower than the softening temperature of the polymer material.

The lens pillar material 22a after being transferred to the first lens pillars 21 and the substrate 11 is the precursor material. In contrast, the lens pillar material after being subjected to the photolithography process is the polymer material.

Figure 5D:
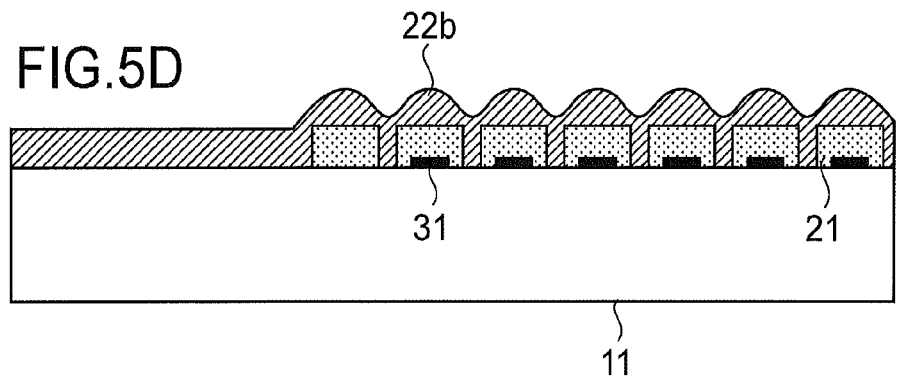

In a process shown in FIG. 5D, the heat treatment is performed to thereby soften the lens pillar material 22a so that the lens pillar material 22a moves down into the gaps 17 while keeping the shapes of the first lens pillars 21 (formed of the polymer material) unchanged. The heat treatment is performed at a temperature at which the lens pillar material 22a is softened, and the shapes of the first lens pillars 21 are kept unchanged.

By applying the heat treatment to the lens pillar material 22a, the lens pillar material 22a (composed of the precursor material) has curved surface portions 22b on the respective first lens pillars 21, and fills the gaps 17 as shown in FIG. 5D. Curvatures and a thickness of the curved surface portions 22b are determined by a relationship between the thickness of the DFR and the first lens pillars 21. The curvatures and the thickness of the curved surface portions 22b are parameters for determining the shapes of the lens portions 23.

(5) Formation of Second Lens Pillars

In a process shown in FIG. 5E, the curved surface portions 22b are subjected to exposure, the post-exposure and the development. With such a process, the curved surface portions 22b are patterned, and the columnar second lens pillars 22 (formed of the polymer material) are formed. Each lens pillar 22 has a curved top surface in a vertical section. The lens pillars 22 are formed on the respective first lens pillars 21 corresponding to the LEDs 31.

(6) Transfer of Lens Portion Material

In a process shown in FIG. 5F, a material 23a of the lens portion 23 (for example, the DFR) is transferred to the first lens pillars 21, the second lens pillars 22 and the substrate 11 so as to leaving gaps 18.

The material 23a of the lens portion 23 (hereinafter referred to as a lens portion material 23a) is preferably a chemically-amplified thick-film negative resist or DFR formed of epoxy-based resin, silicone-based resin, fluorine-based resin or acryl-based resin. The materials of the first lens pillars 21, the second lens pillars 22 and the lens portions 23 can be the same as or different from one another.

In this process, the transferred lens portion material 23a (transferred to the first lens pillars 21, the second lens pillars 22 and the substrate 11) enters into between the first lens pillars 21 and between the second lens pillars 22 so that gaps 18 are formed below the lens portion material 23a. This is achieved by, for example, reducing a pressure in a laminator chamber to a predetermined pressure and at a predetermined temperature.

(7) Heat Treatment

In a process shown in FIG. 5G, the heat treatment is performed to thereby soften the lens portion material 23a while keeping the shapes of the first lens pillars 21 and the second lens pillars 22 (both of which are formed of the polymer material) unchanged. The heat treatment is performed at a temperature at which the lens portion material 23a is softened, and the shapes of the first lens pillars 21 and the second lens pillars 22 are kept unchanged.

By applying the heat treatment to the lens portion material 23a, the lens portion material 23a (formed of the precursor material) has curved surface portions 23b on the second lens pillars 22, and fills the gaps 18 as shown in FIG. 5G.

The shapes of the curved surface portions 23b are determined by the thicknesses of the DFR (i.e., the lens portion material 23a), the first lens pillars 21 and the second lens pillars 22, and the shapes of the second lens pillars 22. A combination of the thicknesses and the shapes of the second lens pillars 22 need be determined so as to obtain a desired radius of curvature and a gap in a direction of the optical axis.

(8) Final Process

In a process shown in FIG. 5H, the lens portion material 23a having the curved surface portions 23b is subjected to the exposure, the post-exposure heat treatment and the development. With this process, the lens portion material 23a is removed from the LMD-outside region 25 and from gaps 19 between the first lens pillars 21. As a result, lens portions 23 of the polymer material are formed as shown in FIG. 5H.

In the process of FIG. 5H, although the lens portion material 23a is removed from the gaps 19 between the microlenses 15, it is also possible that the microlenses 15 are connected with each other.

Next, the lens portions 23 are subjected to a baking treatment. As a result, the microlenses 15 including the first lens pillars 21, the second lens pillars 22 and the lens portions 23 and the dummy microlens 24 are obtained. The microlenses 15 constitute the microlens array 20.

In this regard, if residuum remains on the respective pads in the LMD-outside region 25, the residuum can be removed by plasma treatment using oxygen, argon or the like.

After the microlens array 20 is formed as shown in FIG. 5H, the driving circuit 13 (FIGS. 1 and 2) is fixed to the substrate 11.

<Operation of Display Module>

An operation of the display module 10 will be described with reference to FIGS. 1 to 5H.

When information to be displayed is inputted into the display control unit 13a (FIG. 2), the display control unit 13a supplies the anode driving signal to the anode driver 13b based on the information. In the anode driver 13b, light emission data for the respective LEDs 31 of the first row of the LMD 12 are stored in the shift register in series. The light emission data stored in the shift register are converted into the parallel light emission data, and are stored in the latch circuit. Based on the output signal and the output enable signal of the latch circuit, a desired current is supplied from the constant current circuit to the respective LEDs 31 via the anode wirings 32.

In this state, when the display control unit 13a supplies the cathode driving signal to the cathode drivers 13c and 13d, the selector circuits of the cathode drivers 13c and 13d select the cathode wiring 33 of the first row of the LMD 12. Therefore, the driving current is applied to the LEDs 31 of the first row via the anode wiring 32 of the first row of the LMD 12, and the LEDs 31 of the first row are driven to emit light according to the light emission data.

The light (i.e., light fluxes) emitted by the LEDs 31 is focused by the microlenses 15 of the microlens array 20 shown in FIG. 5H, and are emitted outside.

This light emitting operation is repeated for a plurality of times, i.e., the number of the cathode wirings 33 (i.e., the number of the rows of the LEDs 31), so that light is emitted to form an image including information to be displayed.

<Advantages>

The display module 10 and the manufacturing method thereof according to the Embodiment 1 provide the following advantages (a) to (h).

(a) The patterning of the microlens array 20 can be performed in a similar manner to a usual photolithography process. In particular, the first lens pillars 21 are formed on the LEDs 31, the second lens pillars 22 are formed on the first lens pillars 21, and the lens portions 23 are formed covering the first and second lens pillars 21 and 22, with the result that the LEDs 31 and the microlenses 15 can be accurately aligned with each other.

(b) The microlens array 20 can be formed with a simple method and without requiring a special apparatus.

(c) The microlenses 15 having the thickness of, for example, 10 μm or thicker can be formed without using a conventional forming mold.

(d) The curvatures of the microlenses 15 and gaps in the direction of the optical axis can be arbitrarily adjusted by designing of the first lens pillars 21 and the second lens pillars 22.

(e) Each microlens 15 has a two-stage structure including the first lens pillar 21 and the second lens pillars 22, and therefore the microlens 15 having high aspect ratio can be formed.

(f) The second lens pillars 22 are formed before the lens portions 23 are formed, and therefore control of curvatures of the lens portions 23 can be ensured even at outer peripheries of the lens portions 23.

(g) In the transfer process of FIG. 5C, the precursor material enters into between the first lens pillars 21. In the transfer process of FIG. 5F, the precursor material enters into between the second lens pillars 22. Therefore, the precursor material is bonded to the first lens pillars 21 and the second lens pillars 22 with a strong bonding force. With such a bonding force, in the subsequent heat treatment for forming the curved surface portions, it is possible to prevent rupture due to heated gaps, to prevent separation of the precursor material from the lens pillars, and to allow air to smoothly escape from the gaps to outside.

(h) The microlenses 15 have two-stage structures including the first lens pillars 21 and the second lens pillars 22, and therefore top portions of the microlens 15 become narrow as compared with intervals of the LEDs 31. Therefore, a relatively large amount of the lens portion material 23a (the precursor) enters into the gaps 18 when subjected to the heat treatment. As a result, the microlenses 15 of approximately hemispherical shapes can be formed. Further, even when the microlenses 15 have approximately hemispherical shape, control of curvatures of the microlenses 15 can be ensured even at the outer peripheries of the microlenses 15.

<Modification of Embodiment 1>

In Embodiment 1, the microlens 15 has the two-stage structure including the first lens pillar 21 and the second lens pillar 22. However, the microlens 15 can have multiple-stage structure including three or more stages of the lens pillars. The multiple-stage structure can be obtained by repeating the processes 5C, 5D and 5E for a plurality of times. The multiple-stage structure is advantageous in that the curvatures of the microlenses 15 and the gaps in the direction of the optical axis can be finely adjusted.

Embodiment 2

In Embodiment 2 of the present invention, an external structure and an equivalent circuit of the display module 10 are the same as those of Embodiment 1, and therefore descriptions thereof will be omitted. Hereinafter, description will be made of a difference between Embodiments 1 and 2.

<Configuration of Light Emitting Elements with Lens>

Figure 6:
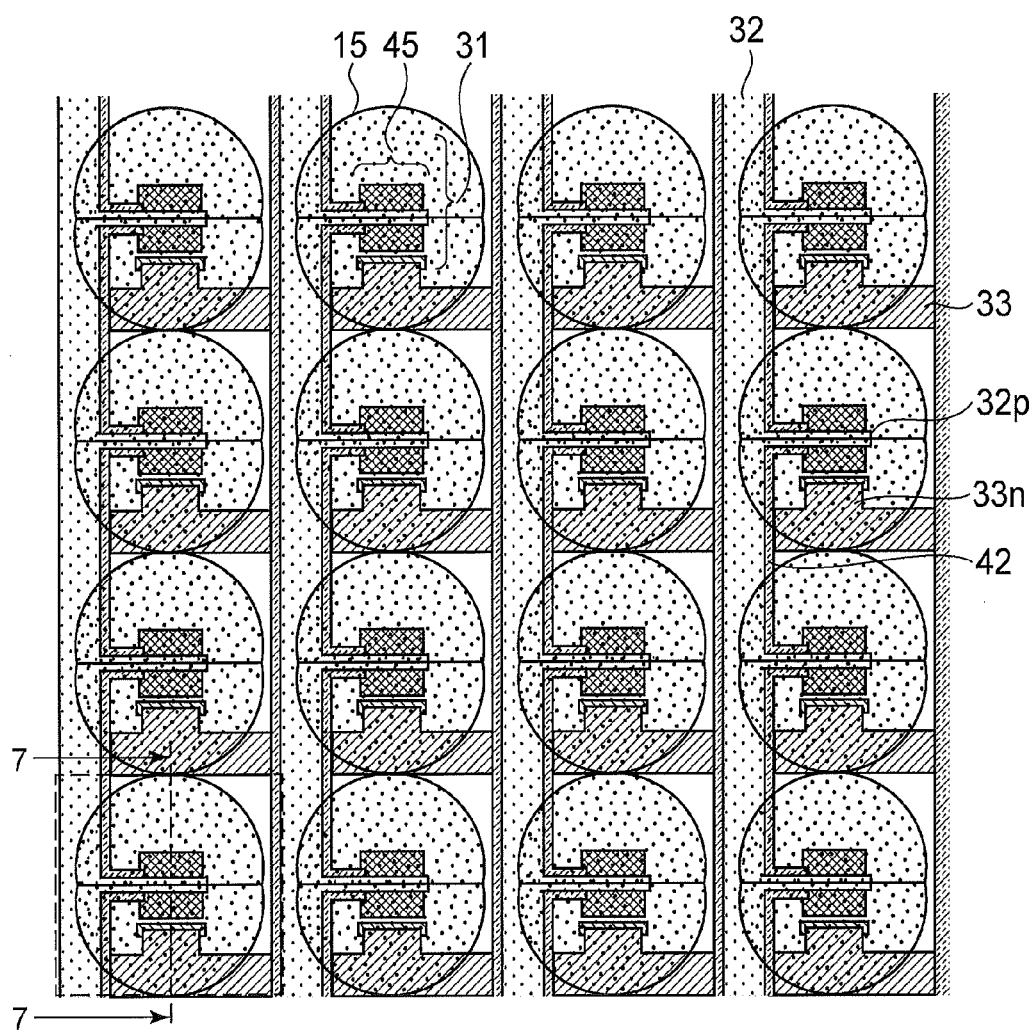
FIG. 6 is an enlarged plan view showing a light emitting element array chip according to Embodiment 2 of the present invention.

FIG. 6 is an enlarged plan view showing a light emitting element array chip according to Embodiment 2 of the present invention.

More specifically, FIG. 6 shows a part of the LMD 12 (FIG. 1) including 4×4 pixels arranged in a matrix. The LMD 12 includes a plurality of LEDs 31 formed on the substrate 11 and a plurality of microlenses 15 formed (and aligned with) the respective LEDs 31.

The LED 15 has a light emitting region 45 having a substantially rectangular shape. The light emitting region 45 is divided by a P-contact electrode 32p into two regions (i.e., upper and lower regions in FIG. 6).

The microlens 15 shown in FIG. 6 has an approximately circular shape, and respective microlenses are isolated from each other. In this regard, the microlens 15 can have a rectangular shape with rounded corners or can also have a shape so as to fill a region of a pixel. Although the light emitting region 45 has an approximately rectangular shape, the light emitting region 45 can have an elongated rectangular shape, an oval shape, a rectangular shape with rounded corners or a polygonal shape.

Figure 7:
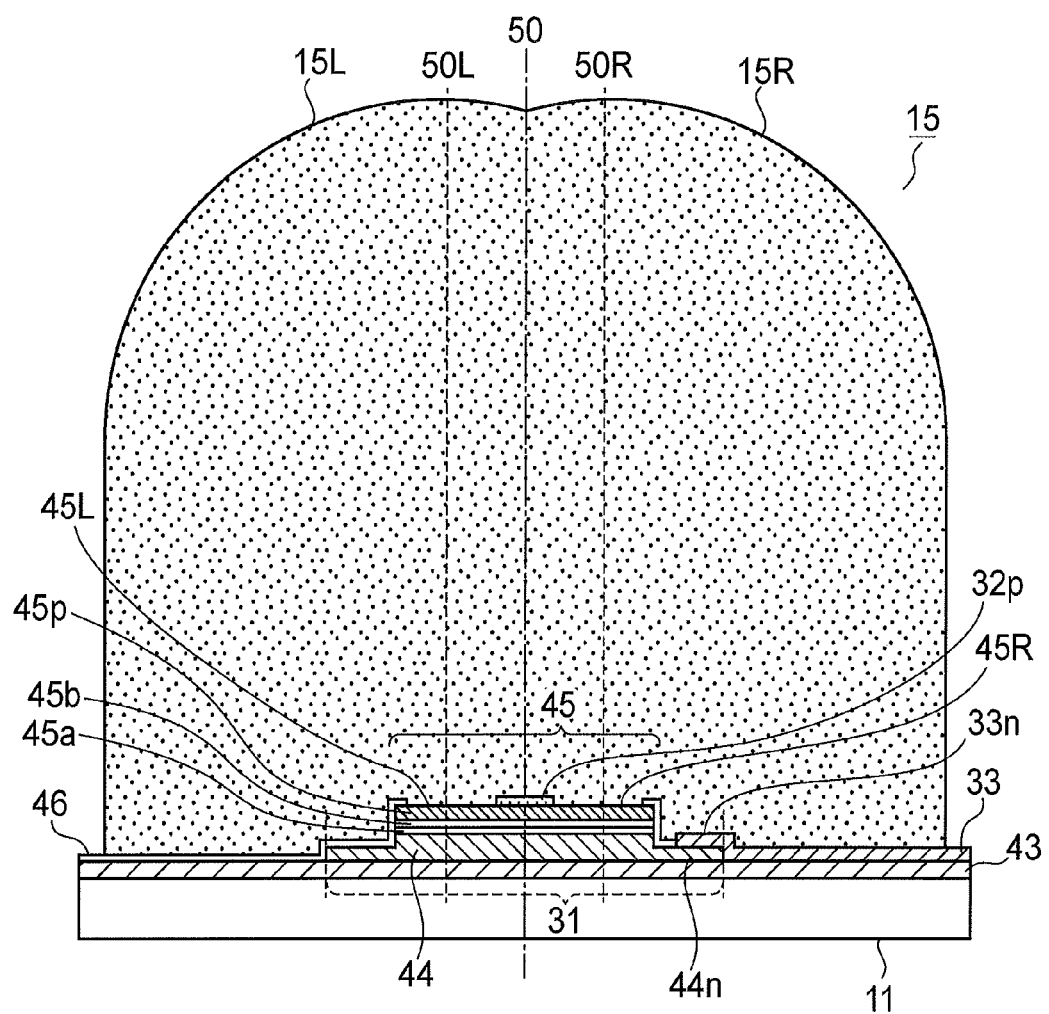
FIG. 7 is an enlarged sectional view taken along line 7-7 in FIG. 6.

FIG. 7 is an enlarged sectional view showing a single pixel taken along line 7-7 in FIG. 6.

The LED 31 having a substantially rectangular shape is bonded to the substrate 11 via the planarization layer 43. On the planarization layer 43, the band-shaped cathode wiring 33 has an N-contact electrode 33n. The N-contact electrode 33n makes an ohmic contact with an N-contact portion 44a of the N-type semiconductor layer 44.

The light emitting region 45 is divided by the P-contact electrode 32p into two left and right regions in FIG. 7. The left light emitting region is referred to as a left light emitting region 45L, and the right light emitting region is referred to as a right light emitting region 45R. In FIG. 7, the light emitting region 45 has a center axis 50 passing a center thereof, the left light emitting region 45L has a center axis 50L passing a center thereof, and the right light emitting region 45R has a center axis 50R passing a center thereof. The microlens has a curved surface combining a lens section 15L having an optical axis aligned with the center axis 50L, and a lens section 15R having an optical axis aligned with the center axis 50R.

<Manufacturing Method of Display Module>

FIGS. 8A through 8G are schematic sectional views for illustrating a manufacturing method of the display module 10 according to Embodiment 2 of the present invention.

Processes (1) through (7) of the manufacturing method of the display module 10 according to Embodiment 2 will be described with reference to FIGS. 8A through 8G.

Figure 8A:
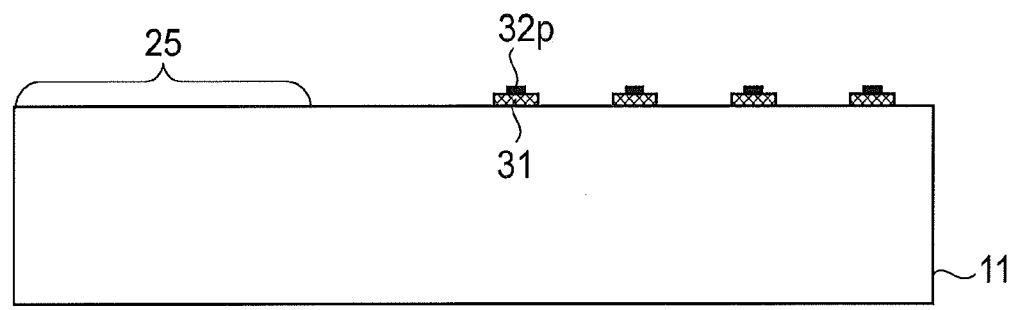
FIGS. 8A through 8G are schematic sectional views for illustrating a manufacturing method of a display module according to Embodiment 2 of the present invention.
Figure 8B:
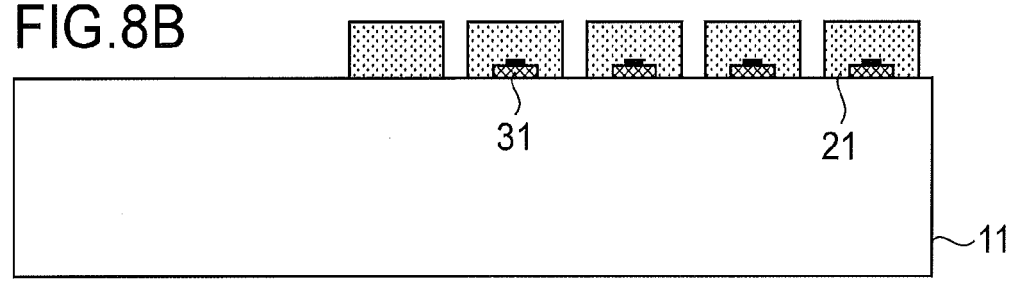
Figure 8C:
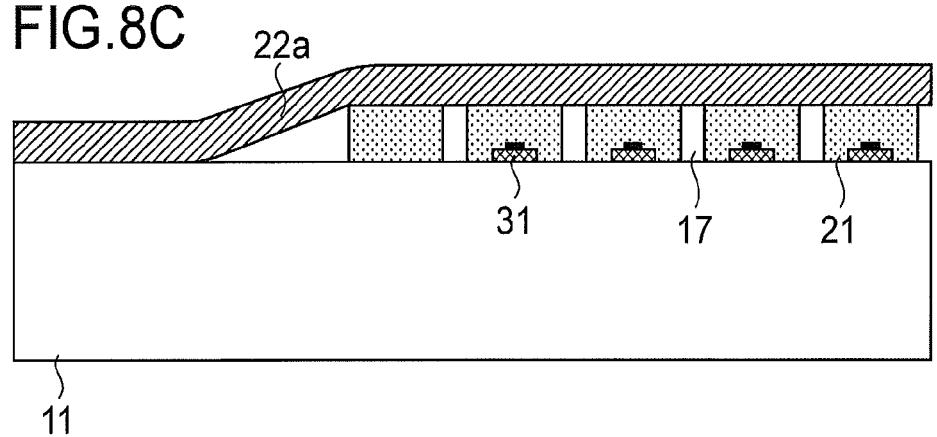

Processes (1) through (3) of Embodiment 2 shown in FIGS. 8A through 8C are the same as those of Embodiment 1 shown in FIGS. 5A through 5C except that the P-contact electrodes 32p are shown in FIGS. 8A through 8C. Therefore, descriptions of the processes (1) through (3) will be omitted.

(4) Formation of Second Lens Pillars

Figure 8D:
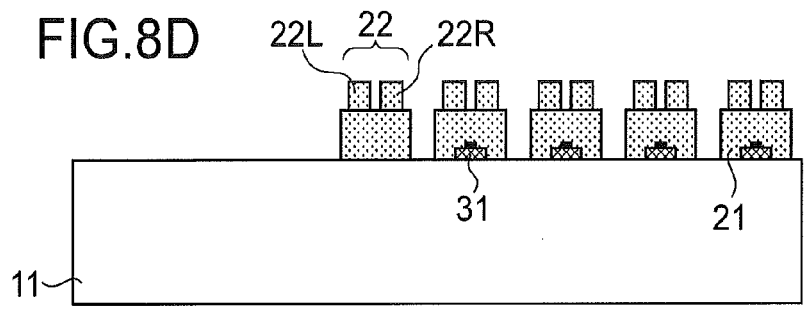

In a process shown in FIG. 8D, a plurality of second lens pillars 22 (22L, 22R) are formed on the first lens pillars 21. In this process, the lens pillar material 22a (for example, the DFR) transferred to the first lens pillars 21 and the substrate 11 in the previous process (FIG. 8C) are patterned using a photolithography process.

More specifically, the second lens pillar 22L is formed on a left position on the first lens pillar 21 distanced from a center of the first lens pillar 21 by a predetermined amount. The second lens pillar 22R is formed on a right position on the first lens pillar 21 distanced from a center of the first lens pillar 21 by a predetermined amount.

By adjusting positions and cross sectional areas of the first lens pillar 21 and the second lens pillars 22L and 22R, the height of the lens portion 23 (FIG. 8G) and the curvatures of combined surfaces of the lens portion 23 can be arbitrarily controlled.

(5) Transfer of Lens Portion Material

Figure 8E:
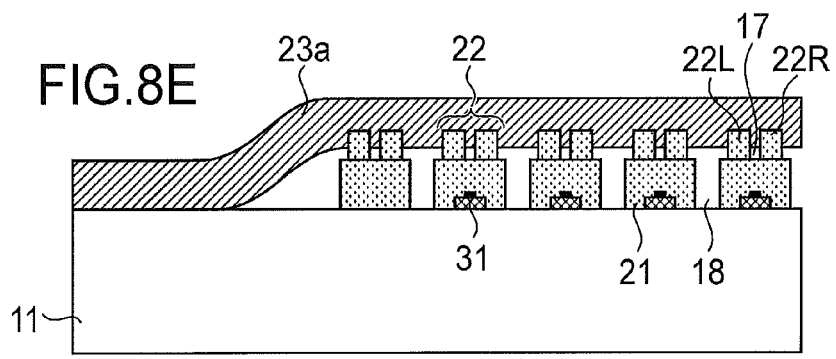

In a process shown in FIG. 8E, the lens portion material 23a (for example, the DFR) is transferred to the first lens pillars 21, the second lens pillars 22L and 22R, and the substrate 11.

In this process, the transferred lens portion material 23a enters into between the second lens pillars 22L and 22R so that gaps 17 are formed below the lens portion material 23a.

Further, the transferred lens portion material 23a enters into between the second lens pillars 22 and between the first lens pillars 21 so that gaps 18 are formed below the lens portion material 23a. This is achieved by, for example, reducing a pressure in a laminator chamber to a predetermined pressure at a predetermined temperature.

(6) Heat Treatment

Figure 8F:
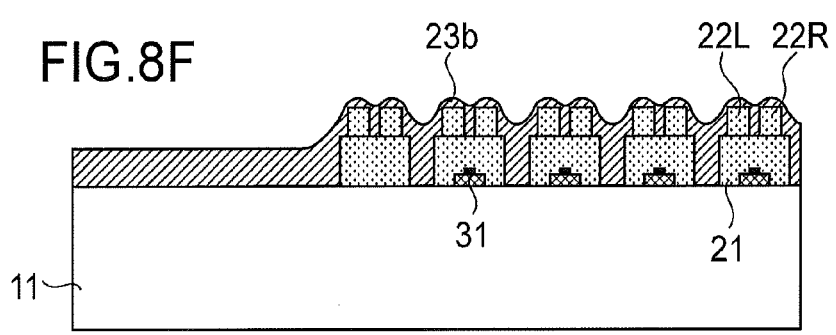

In a process shown in FIG. 8F, the transferred lens portion material 23a (for example, the DFR) is a precursor material. In contrast, the first lens pillars 21 and the second lens pillars 22 (22L and 22R) are a polymer material.

In this process, the heat treatment is performed to thereby soften the lens portion material 23a while keeping the shapes of the first lens pillars 21 and the second lens pillars 22 unchanged. The softened lens portion material 23a enters into the gaps 17 and 18.

The heat treatment is performed at a temperature at which the lens portion material 23a is softened, and the shapes of the first lens pillars 21 and the second lens pillars 22 (22L and 22R) are kept unchanged.

By applying the heat treatment to the lens portion material 23a, the lens portion material 23a has curved surface portions 23b on the second lens pillars 22L and 22R, and fills the gaps 17 and 18 as shown in FIG. 8F. The lens portion 23 of each pixel has a combined shape of a curved surface of the lens section 15L (having the optical axis aligned with the center axis 50L) and a curved surface of the lens section 15R (having the optical axis aligned with the center axis 50R) as shown in FIG. 7.

The heights and the curvatures of the curved surface portions 23b (i.e., a combination of a plurality of curved surfaces) are arbitrarily determined by adjusting the thicknesses of the lens portion material 23a (for example, the DFR) and a temperature condition.

(7) Final Process

Figure 8G:
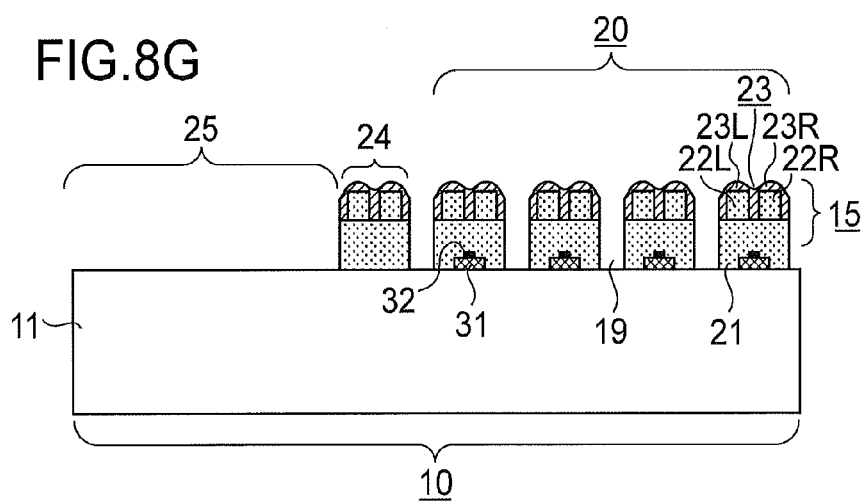

In a process shown in FIG. 8G, the lens portion material 23a having the lens surface portions 23b (each of which has a combined curved surfaces) is subjected to the exposure, the post-exposure heat treatment and the development. The lens portion material 23a is removed from the LMD-outside region 25, and the lens portions 23 of the polymer material are formed as shown in FIG. 8G.

In the process of FIG. 8G, although the lens portion material 23a is removed from the gaps 19 between the microlenses 15, it is also possible that the microlenses 15 are connected with each other.

Next, the lens portions 23 are subjected to a baking treatment. As a result, the microlenses 15 including the first lens pillars 21, the second lens pillars 22 (22L, 22R) and the lens portions 23 and the dummy microlens 24 are obtained. The microlenses 15 constitute the microlens array 20. In this regard, if residuum remains on the respective pad in the LMD-outside region 25, the residuum can be removed by plasma treatment using oxygen, argon or the like.

After the microlens array 20 is formed as shown in FIG. 8G, the driving circuit 13 (FIGS. 1 and 2) is fixed to the substrate 11.

<Operation of Display Module>

As shown in FIG. 7, in the display module 10 of Embodiment 2, the light emitting region 45 of each LED 31 is divided into two regions by the P-contact electrode 32p. The center axis 50L of the left light emitting region 45L passes an apex of the left lens section 15L, and the center axis 50R of the right light emitting region 45R passes an apex of the right lens section 15R.

The light emitted by the light emitting regions 45L and 45R of each LED 31 is focused by the microlens 15 (i.e., the lens sections 15L and 15R) aligned with the center axes 50L and 50R of the light emitting regions 45L and 45R, and is emitted outside.

<Advantages of Embodiment 2>

The display module 10 and the manufacturing method thereof according to Embodiment 2 provide the following advantages (i) through (k) in addition to the advantages described in Embodiment 1:

(i) Each second lens pillar 22 includes a plurality of lens pillar 22L and 22R, and therefore it becomes possible to form the lens portion 23 each having a plurality of combined curved surfaces.

(j) The light emitting region 45 is divided into a plurality of regions 45L and 45R, and the microlens 15 has a plurality of apexes corresponding to optical axes (i.e., center axes 50L and 50R) of the divided regions 45L and 45R. Therefore, the display module 10 can provide high light use efficiency.

(k) In the transfer process of FIG. 8E, the precursor material enters into the gaps 17 between the second lens pillars 22L and 22R. In the transfer process of FIG. 8F, the precursor material enters into the gaps 17 between the first lens pillars 21. Therefore, the precursor material is bonded to the first lens pillars 21 and the second lens pillars 22 with a strong bonding force. With such a bonding force, in the subsequent heat treatment for forming the curved surface portions, it is possible to prevent rupture due to heated gaps, to prevent separation of the precursor material from the lens pillars, and to allow air to smoothly escape from the gaps to outside.

<Modification of Embodiment 2>

In FIGS. 6 through 8G, one LED 31 is provided for each pixel. However, it is also possible that a plurality of LEDs 31 are connected in series for each pixel.

Figure 9:
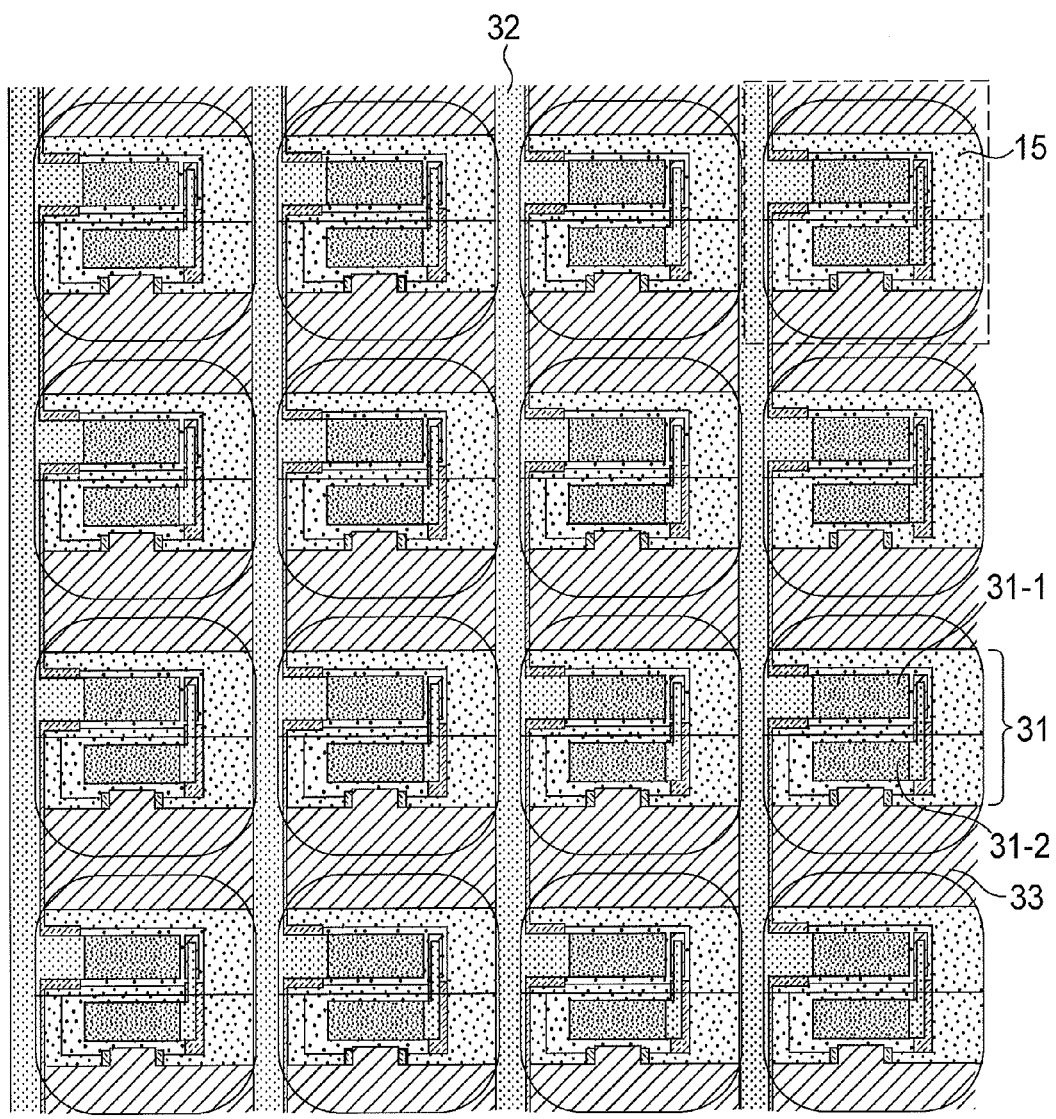
FIG. 9 is an enlarged plan view showing a light emitting element array chip according to a modification of Embodiment 2 of the present invention.

FIG. 9 is an enlarged plan view showing a light emitting element array chip according to the modification of Embodiment 2. More specifically, FIG. 9 is an enlarged partial plan view showing a part of the LMD 12 including 4×4 pixels. Each pixel includes LEDs 31-1 and 31-2 which are connected in series. In other respect, the light emitting element array chip shown in FIG. 9 is the same as that shown in FIG. 6.

Figure 10:
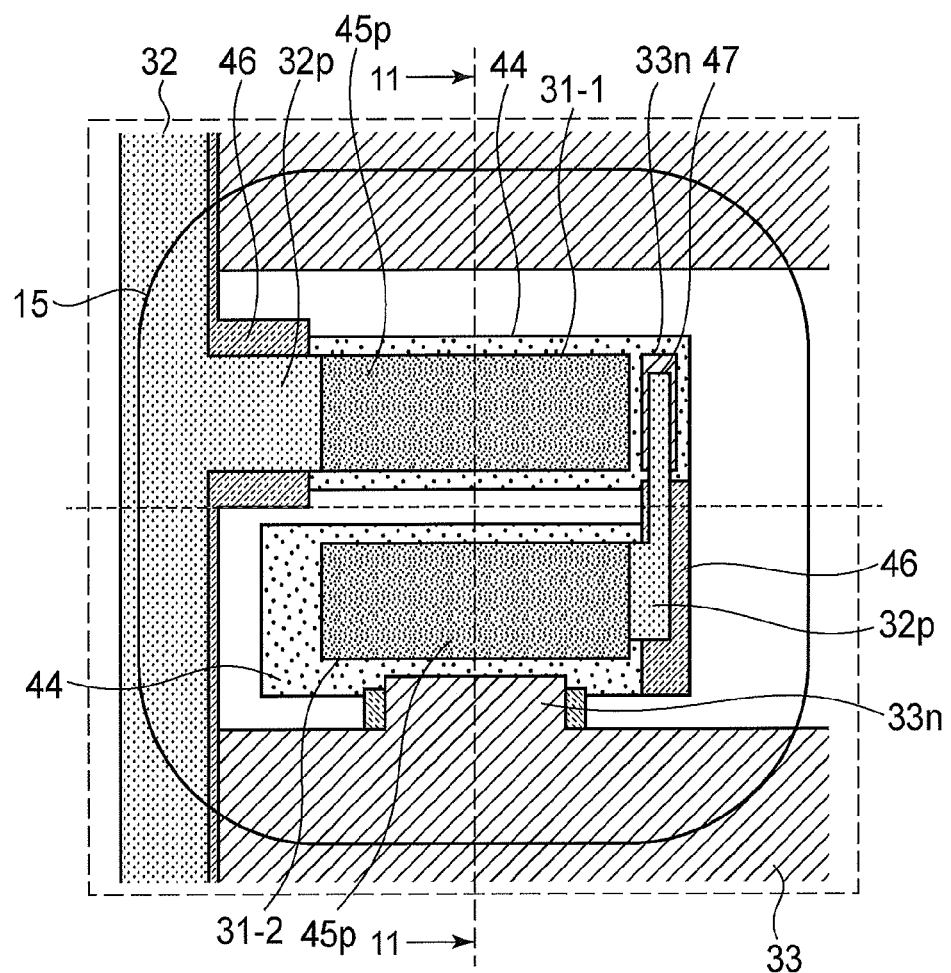
FIG. 10 is an enlarged plan view showing a pixel of the light emitting element array chip of FIG. 9.

FIG. 10 is an enlarged plan view showing a part of the light emitting element array chip corresponding to a single chip. The P-contact electrode 32p extending from the anode wiring 32 is formed on the insulation layer 46, and makes an ohmic contact with the P-type semiconductor layer 45p of the LED 31-1. The N-contact electrode 33n makes an ohmic contact with the N-type semiconductor layer 44 of the LED 31-1. The N-contact electrode 33n of the LED 31-1 and the P-contact electrode 32p of the LED 31-2 are connected via a serial connection wiring 47, so that the LED 31-1 and the LED 31-2 are electrically connected with each other. The P-contact electrode 32p and the P-type semiconductor layer 45p of the LED 31-2 make ohmic contact with each other. The N-contact electrode 33n makes an ohmic contact with the N-type semiconductor layer 44 of the LED 31-2, and is connected to the cathode wiring 33.

Figure 11:
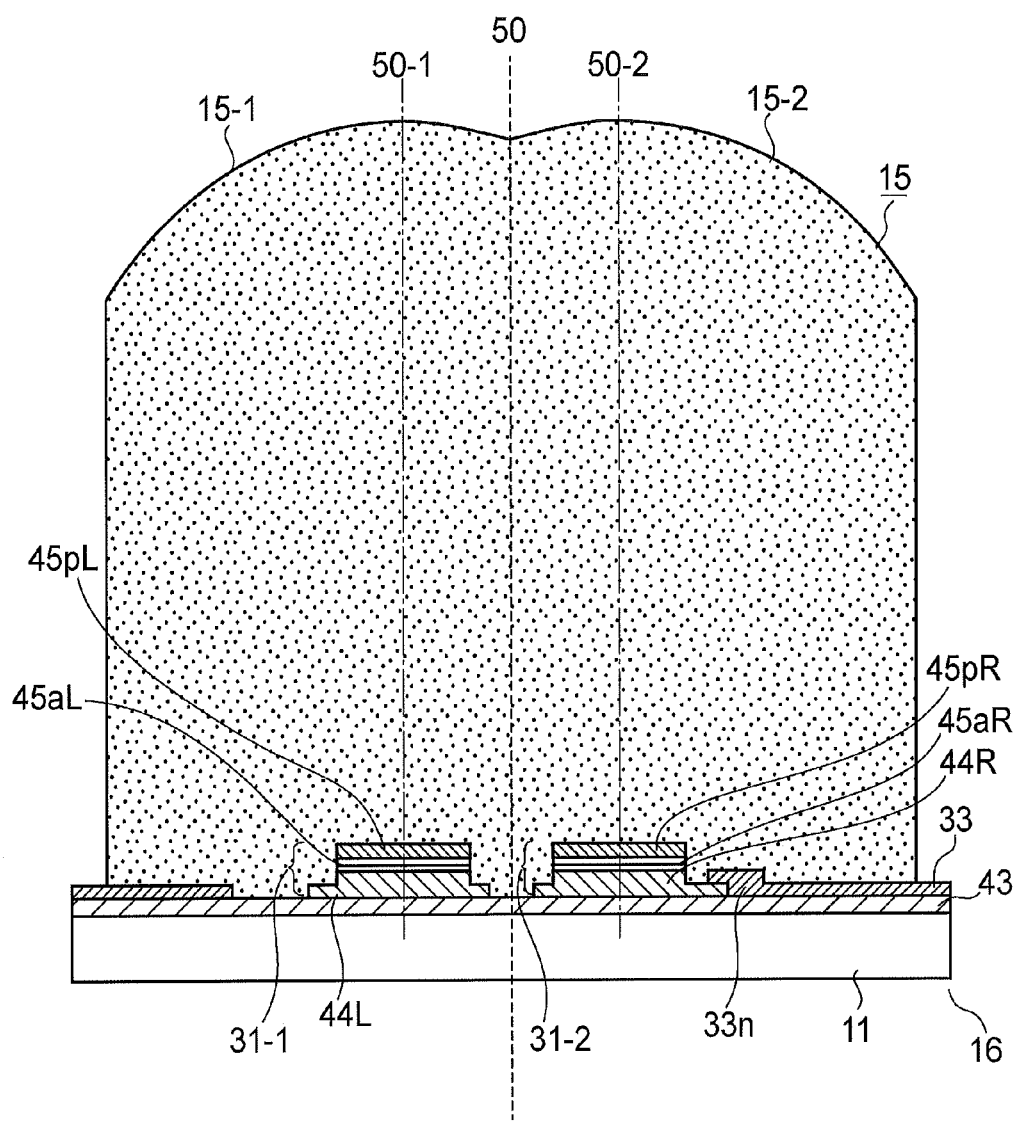
FIG. 11 is an enlarged sectional view taken along line 11-11 in FIG. 10.

FIG. 11 is an enlarged sectional view showing a pixel taken long line 11-11 in FIG. 10. The LEDs 31-1 and 31-2 are bonded to the substrate 11 via the planarization layer 43. The LEDs 31-1 and 31-2 include the N-type semiconductor layers 44L and 44R bonded to the planarization layer 43, the active layers 45aL and 45aR, and the P-type semiconductor layers 45pL and 45pR (at the surfaces of the LEDs 31-1 and 31-2)

and the like. The LEDs 31-1 and 31-2 are surrounded by a not shown insulation layer. The N-type semiconductor layer 44R of the LED 31-2 makes an ohmic contact with the N-contact electrode 33n, and is connected to the cathode wiring 33.

The LED 31 is divided into two elements, i.e., the LEDs 31-1 and 31-2. A center axis of the light emitting region of the LED 31-1 is referred to as a center axis 50-1. A center axis of the light emitting region of the LED 31-2 is referred to as a center axis 50-2. The microlens has a curved surface combining a lens section 15-1 having an optical axis aligned with the center axis 50-1, and a lens section 15-2 having an optical axis aligned with the center axis 50-2.

As described in Embodiment 1, the LEDs 31-1 and 31-2 emit light based on the light emission data. The emitted light is focused by the lens sections 15-1 and 15-2, and is emitted outside.

<Another Modification of Embodiment 2>

Figure 12:
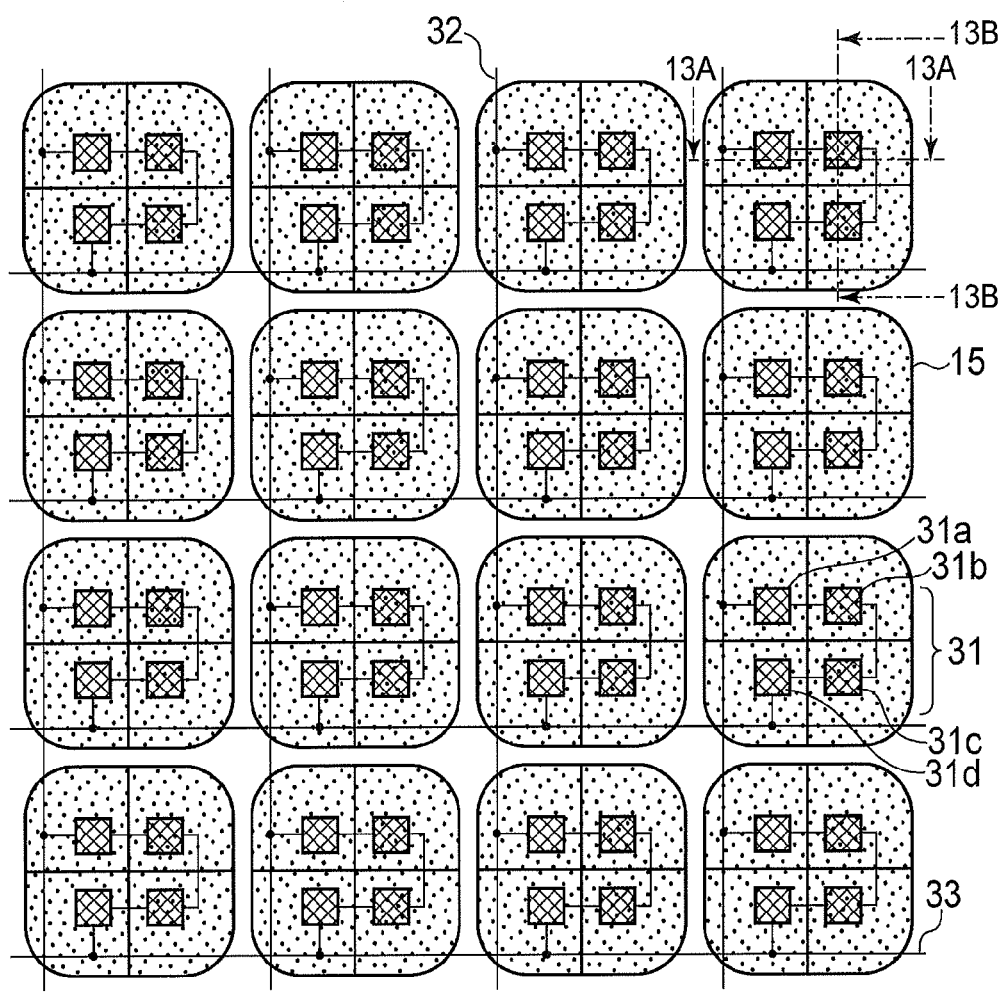
FIG. 12 is an enlarged plan view showing a light emitting element array chip according to another modification of Embodiment 2 of the present invention.

FIG. 12 is an enlarged plan view showing a light emitting element array chip according to another modification of Embodiment 2 of the present invention.

More specifically, FIG. 12 is an enlarged partial plan view showing a part of the LMD 12 including 4×4 pixels. Each pixel includes LEDs 31a, 31b, 31c and 31d connected in series. The LED 31a is connected to the anode wiring 32, and the LED 31d is connected to the cathode wiring 33.

Figure 13A:
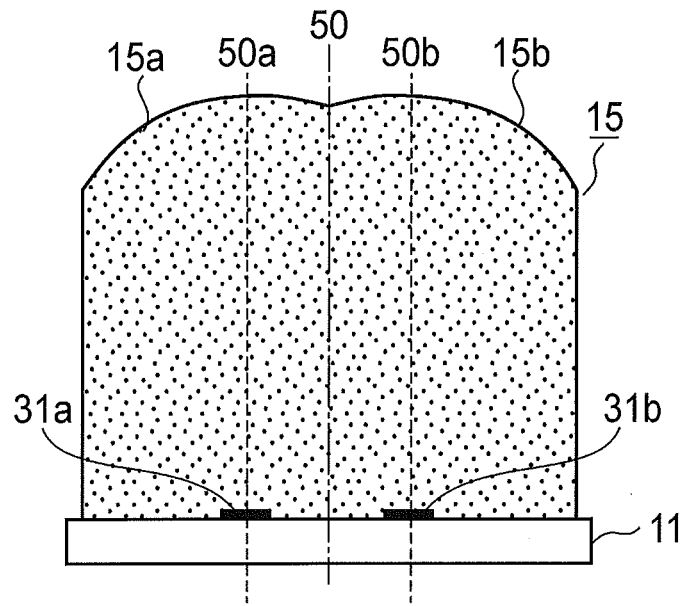
FIGS. 13A and 13B are enlarged sectional views respectively taken along a line 13A-13A and a line 13B-13B in FIG. 12.
Figure 13B:
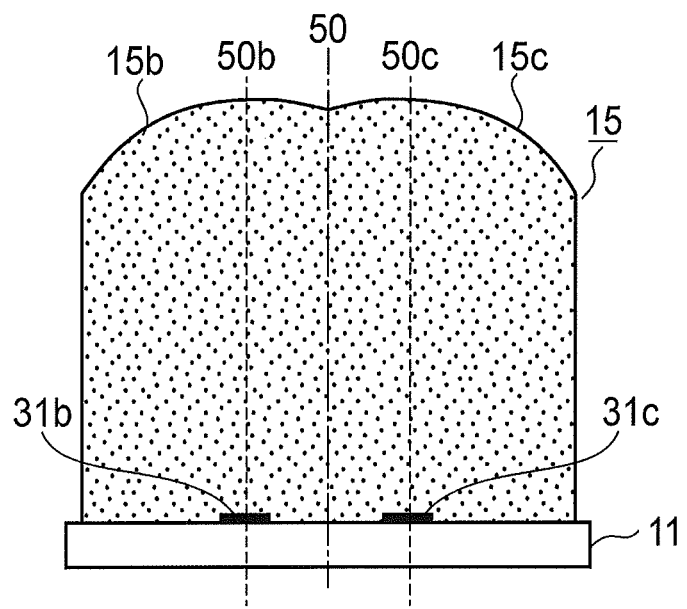

FIG. 13A is an enlarged sectional view taken along line 13A-13A in FIG. 12. FIG. 13B is an enlarged sectional view taken along line 13B-13B in FIG. 12. As shown in FIGS. 13A and 13B, the optical axes of curved surfaces (i.e., lens sections 15a, 15b, 15c and 15d) of the microlens 15 are aligned with center axes 50a, 50b, 50c and 50d of the light emitting regions of the LEDs 31a, 31b, 31c and 31d. With such a configuration, light can be efficiently emitted outside, and light use efficiency can be enhanced.

Embodiment 3

<Configuration of Projection Type Display Device>

Figure 14:
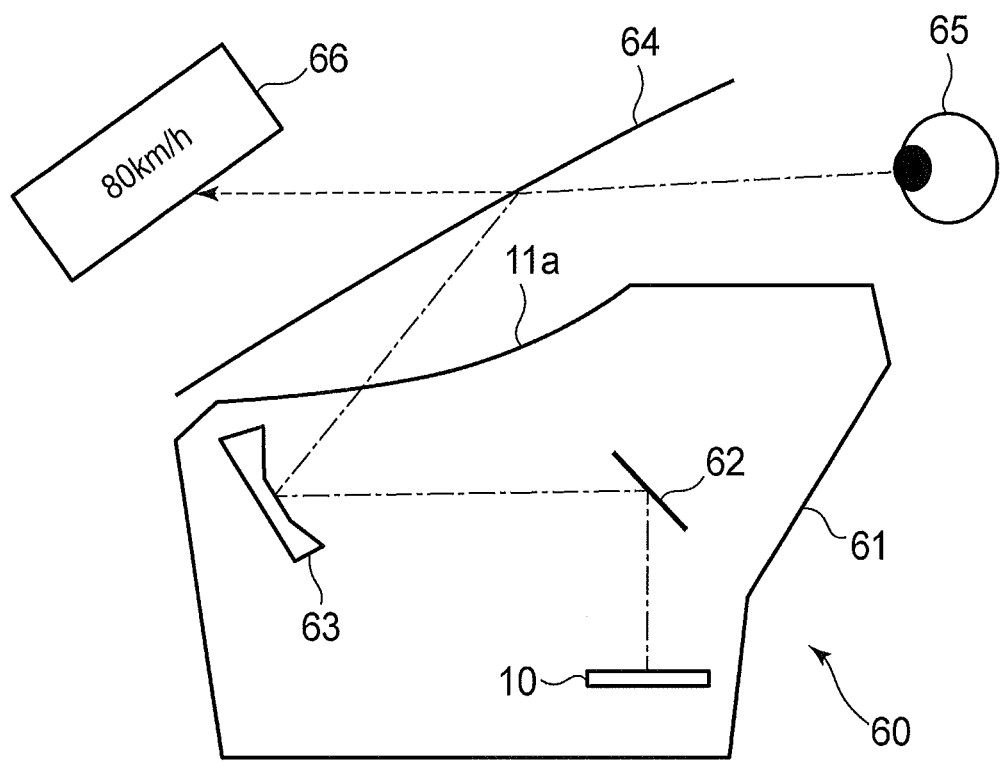
FIG. 14 is a schematic view showing a projection type display device according to Embodiment 3 of the present invention.

FIG. 14 is a schematic view showing a projection type display device 60 according to Embodiment 3 of the present invention using the display module 10 according to Embodiments 1 or 2.

The projection type display device 60 is, for example, an HUD (Head Up Display) provided in a vehicle, aircraft or the like. The projection type display device 60 is configured to display various kinds of information, for example, information outputted by various indicators such as a speed meter or fuel meter, map information outputted by a navigation system, image information taken by an imaging device, or the like. The projection type display device 60 has a housing 61 having a window 61a on a top surface thereof. The housing 61 is mounted to, for example, a backside of an instrument panel of the vehicle. The display module 10 according to Embodiment 1 or 2 is mounted to a lower part of the housing 61.

An optical system is provided above and on a light emission side of the display module 10, and projects light emitted by the display module 10. For example, the optical system includes a plane mirror 62 for reflection, and a concave mirror 63 for engagement. The plane mirror 62 reflects the light emitted by the display module 10 in a predetermined direction (for example, approximately horizontal direction). The concave mirror 63 is disposed on a reflection side of the plane mirror 62. The concave mirror 63 focuses the light from the plane mirror 62 onto a windshield plate 64 (i.e., glass plate) via the window 61a of the housing 60, so as to form an image on the windshield plate 64 in an enlarged scale.

<Operation of Projection Type Display Device>

When the display control unit 13a (FIG. 2) of the display module 10 of the projection type display device 60 (HUD) receives information to be displayed, the control unit 13a supplies the anode driving signal to the anode driver 13b (FIG. 2) of the display module 10, and supplies the cathode driving signal to the cathode drivers 13c and 13d. Then, the LEDs 31 of the LMD 12 of the display module 10 emit light, and the light is emitted via the microlens array 20 to the outside of the display module 10.

The light emitted by the display module 10 is reflected by the plane mirror 62 and the concave mirror 63 (FIG. 14), and is incident on the windshield plate 64 to form a virtual image 66 on a front side of the windshield plate 64 in a direction of a line of vision. Therefore, a driver 65 can see various kinds of information contained in the image formed by the light emitted by the display module 10, while keeping eyes on the front side.

<Advantages>

The projection type display device 60 of Embodiment 3 uses the display module 10 of Embodiment 1 or 2, and therefore a spread of the light emitted by the LMD 12 is narrowed by the microlens array 20. In other words, a directivity of the light emitted by the display module 10 is enhanced, and therefore the light use efficiency is enhanced. Thus, even if a length of a light path from an emitting surface of the display module 10 to an image projection surface (i.e., the windshield plate 64) is long, the light emitted by the display module 10 can be efficiently projected onto the image projection surface. Further, the HUD as the projection type display device 60 can be simple in structure and compact in size.

Embodiment 4

Figure 15:
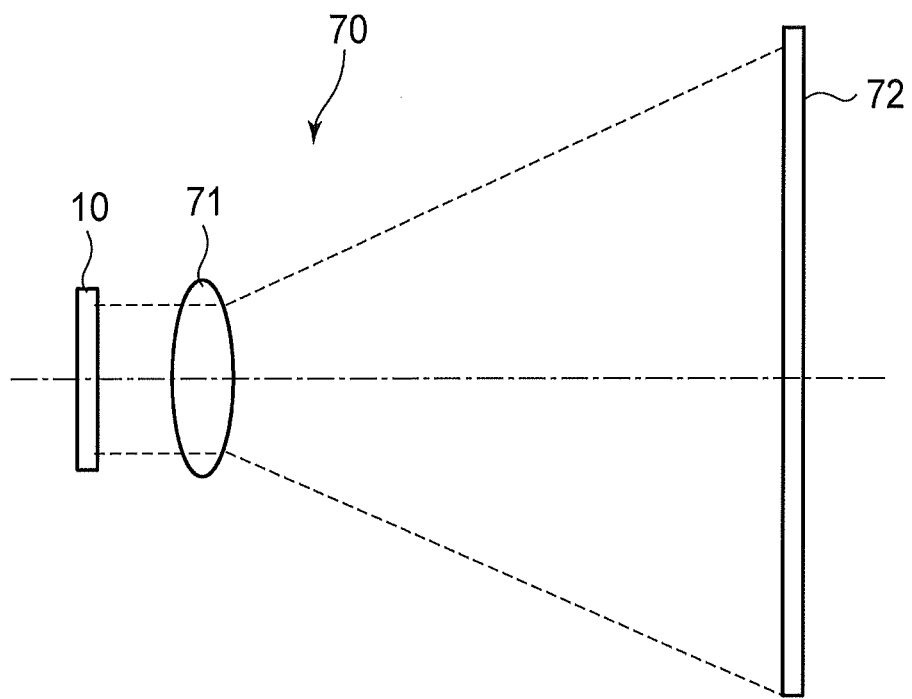
FIG. 15 is a schematic view showing a front-projection type display device according to Embodiment 4 of the present invention.

FIG. 15 is a schematic view showing a front-projection type display device 70 according to Embodiment 4 of the present invention using the display module 10 Embodiment 1 or 2.

The front-projection type display device 70 is, for example, a front projector. The front-projection type display device 70 includes the display module 10 of Embodiment 1 or 2. The light emitted by the display module 10 is projected onto a screen 72 via an optical system 71 (such as a projection lens) in an enlarged scale so that an image is formed on the screen 72.

The front-projection type display device 70 of Embodiment 4 uses the display module 10 of Embodiment 1 or 2, and therefore provides substantially the same advantages as described in Embodiment 3.

Embodiment 5

Figure 16:
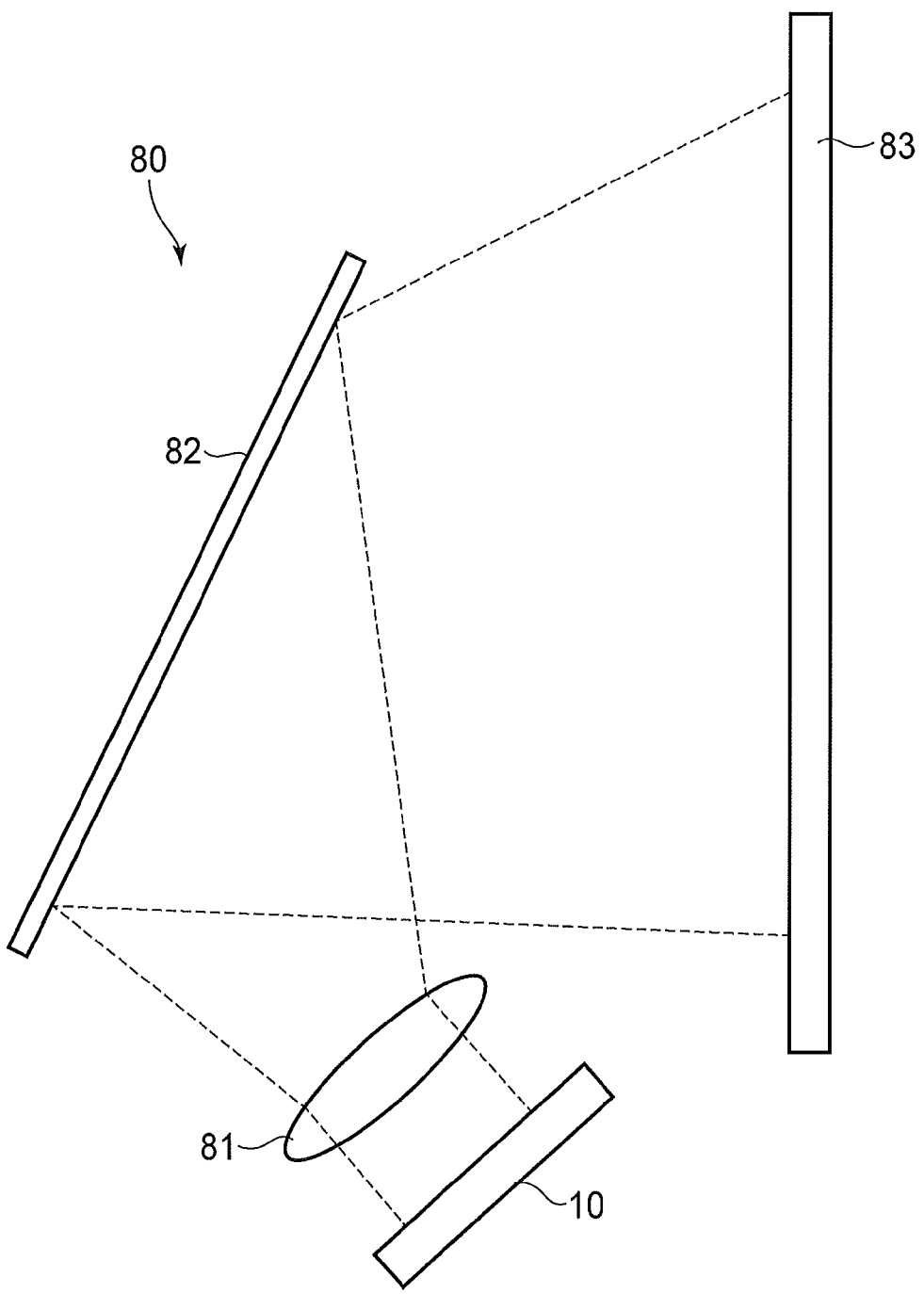
FIG. 16 is a schematic view showing a rear-projection type display device according to Embodiment 5 of the present invention.

FIG. 16 is a schematic view showing a rear-projection type display device 80 according to Embodiment 5 of the present invention using the display module 10 according to Embodiment 1 or 2.

The rear-projection type display device 80 is, for example, a rear projector. The rear-projection type display device 80 includes the display module 10 of Embodiment 1 or 2, and an optical system (such as a projection lens 81 and a reflection mirror 82) that reflects the light emitted by the display module 10 to a screen 83 so as to project an image onto the screen 83 in an enlarged scale from backside.

The rear-projection type display device 80 of Embodiment 5 uses the display module 10 of Embodiment 1 or 2, and therefore provides substantially the same effects as described in Embodiment 3.

Embodiment 6

Figure 17:
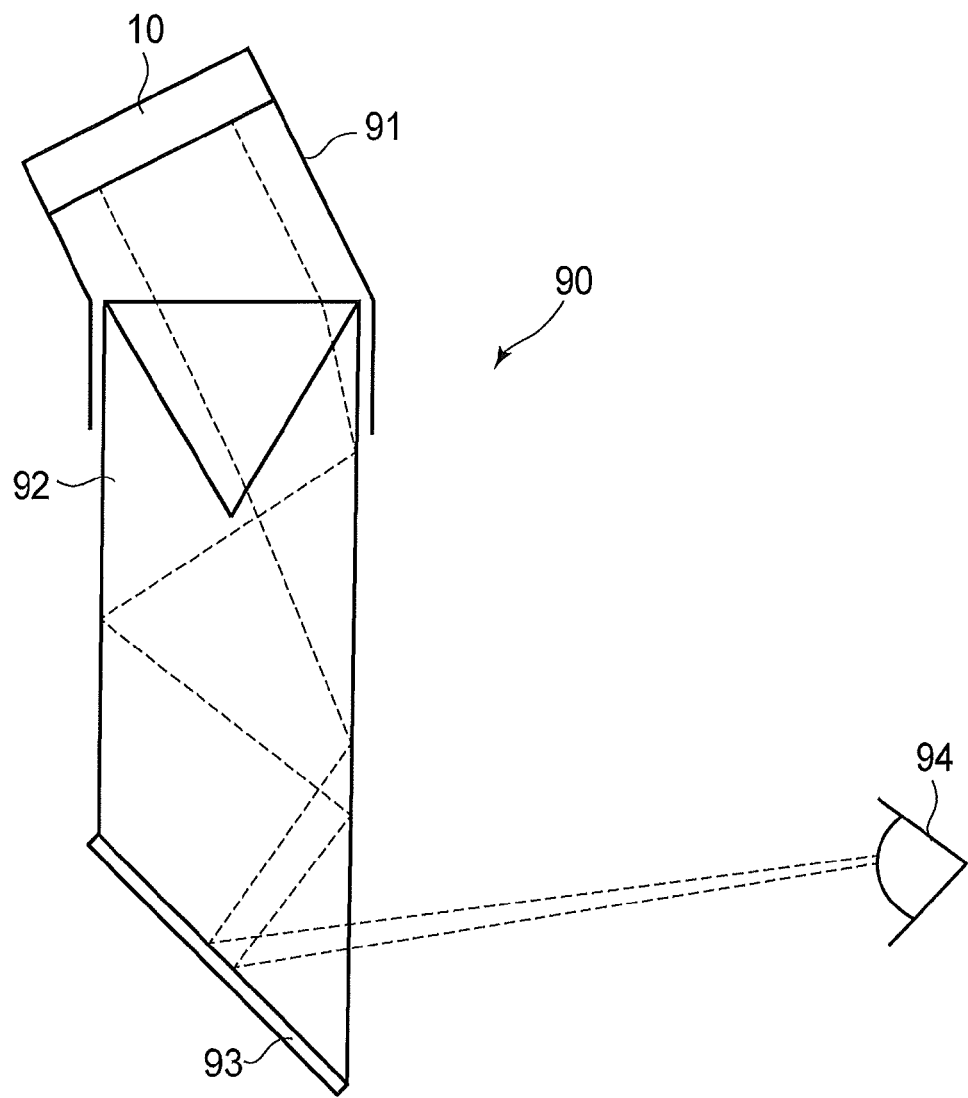
FIG. 17 is a schematic view showing a display device according to Embodiment 6 of the present invention.

FIG. 17 is a schematic view showing a display device according to Embodiment 6 of the present invention using the display module 10 according to Embodiment 1 or 2.

The display device 90 is, for example, a head mount display mounted to eyeglass. The display device 90 includes the display module 10 of Embodiment 1 or 2, and a case 91 that houses the display module 10. An eyepiece optical system is fixed to the case 91. The eyepiece optical system includes, for example, a prism 92 and a sheet-like hologram optical element 93 fixed to a lower end of the prism 92.

The light emitted by the display module 10 is incident on the prism 92, reflected inside the prism 92, and reaches the hologram optical element 93 provided at the lower end of the prism 92. The hologram optical element 93 causes interference of lights and forms a virtual image viewable by an eye 94 of a user. Therefore, the user is able to view the image formed by the light emitted by the display module 10.

The display device 90 of Embodiment 6 uses the display module 10 of Embodiment 1 or 2, and therefore provides substantially the same effects as described in Embodiment 3.

The above described first to sixth embodiments and the modifications thereof can be further modified as follows.

The configuration and manufacturing method of the display module 10 of Embodiments 1 and 2 can be modified to other configuration and manufacturing method. To be more specific, although the semiconductor light emitting elements of Embodiment 1 or 2 include the LEDs 31, the LEDs 31 can be replaced with EL elements composed of organic or inorganic material. Such a modification offers substantially the same advantages as those of Embodiments 1 and 2.

Further, the display module 10 of Embodiment 1 and 2 can be employed in other display devices than those of Embodiments 3 through 6. For example, the display module 10 of Embodiment 1 and 2 are applicable to a direct-view-type display device that does not use a projection optical system other than the microlens array. In this case, the display device having high directivity and having high resolution in a certain direction is obtained.

While the preferred embodiments of the present invention have been illustrated in detail, it should be apparent that modifications and improvements may be made to the invention without departing from the spirit and scope of the invention as described in the following claims.

What is claimed is:

1. A display module comprising:
a light emitting element array including a plurality of light emitting elements disposed on a substrate and driven by driving signal to emit light;
a lens array configured to focus light emitted by said respective light emitting elements, said lens array including:
a plurality of first lens pillars respectively provided on said light emitting elements, said plurality of first lens pillars respectively contacting corresponding light emitting elements;
a plurality of second lens pillars respectively provided on said first lens pillars and having curved surfaces at tops thereof, said plurality of second lens pillars respectively contacting corresponding first lens pillars; and
a plurality of lens portions formed so as to cover said first lens pillars and said second lens pillars, said lens portions having curved surfaces at tops thereof; and
a driving circuit provided on said substrate.

2. A display device comprising said display module according to claim 1, said display device being configured to display an image using light emitted by said lens array.

3. The display device according to claim 2, further comprising an optical system for projecting light emitted by said lens array on a predetermined portion to display an image.

4. The display device according to claim 3, wherein said predetermined portion is a screen or a half mirror.

5. The display device according to claim 3, wherein said predetermined portion is a hologram element.

6. A display module comprising:
a light emitting element array including a plurality of light emitting elements disposed on a substrate and driven by driving signal to emit light;
a lens array configured to focus light emitted by said respective light emitting elements, said lens array including:
a plurality of first lens pillars respectively provided on said light emitting elements, said plurality of first lens pillars respectively contacting corresponding light emitting elements;
a plurality of second lens pillars respectively provided on said first lens pillars in such a manner that at least two second lens pillars are provided on each first lens pillar, said plurality of second lens pillars respectively contacting corresponding first lens pillars; and
a plurality of lens portions formed so as to cover said first lens pillars and said second lens pillars, each lens portion having at least two tops respectively having curved surfaces; and
a driving circuit provided on said substrate.

7. A display device comprising said display module according to claim 6, said display device being configured to display an image using light emitted by said lens array.

8. The display device according to claim 7, further comprising an optical system that projects light emitted by said lens array on a predetermined portion to display an image.

9. The display device according to claim 8, wherein said predetermined portion is a screen or a half mirror.

10. The display device according to claim 8, wherein said predetermined portion is a hologram element.

11. A manufacturing method of a display module, said manufacturing method comprising:
forming a light emitting element array including a plurality of light emitting elements on a substrate;
forming a plurality of first lens pillars respectively on said light emitting elements;
forming a lens pillar material so as to cover said first lens pillars and said substrate;
softening said lens pillar material by heat treatment so that said lens pillar material has curved surfaces respectively on said first lens pillars;
performing a photolithography process on said lens pillar material to thereby form a plurality of second lens pillars having curved surfaces;
forming a lens portion material so as to cover said first lens pillars, said second lens pillars and said substrate;
softening said lens portion material by heat treatment so that said lens portion material has curved surfaces respectively on said second lens pillars;
performing a photolithography process on said lens portion material to thereby form polymerized lens portions, and
fixing a driving circuit on said substrate for driving said respective light emitting elements.

12. A manufacturing method of a display module, said manufacturing method comprising:

forming a light emitting element array including a plurality of light emitting elements on a substrate, forming a plurality of first lens pillars respectively on said light emitting elements, forming a lens pillar material so as to cover said first lens pillars and said substrate, patterning said lens pillar material by a photolithography process to thereby form a plurality of second lens pillars in such a manner that at least two second lens pillars are provided on each first lens pillar, forming a lens portion material so as to cover said first lens pillars, said second lens pillars and said substrate, softening said lens portion material by heat treatment so that said lens portion material has curved surfaces respectively on said second lens pillars, performing a photolithography process on said lens portion material to thereby form polymerized lens portions, and fixing a driving circuit on said substrate for driving said respective light emitting elements.

13. The display module according to claim 1, wherein said first lens pillars, said second lens pillars and said lens portions are composed of photoresist.

14. The display module according to claim 13, wherein said photoresist is dry film resist.

15. The display module according to claim 6, wherein said first lens pillars, said second lens pillars and said lens portions are composed of photoresist.

16. The display module according to claim 15, wherein said photoresist is dry film resist.

17. The display module according to claim 6, wherein a light emitting region of each of said light emitting elements is divided into two regions whose center axes respectively pass through said tops of said lens portion.

* * * * *